US011508705B2

(12) United States Patent
Nishiyama

(10) Patent No.: US 11,508,705 B2
(45) Date of Patent: Nov. 22, 2022

(54) METHOD OF MANUFACTURING LIGHT-EMITTING DEVICE

(71) Applicant: NICHIA CORPORATION, Anan (JP)

(72) Inventor: Hirofumi Nishiyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 66 days.

(21) Appl. No.: 17/216,324

(22) Filed: Mar. 29, 2021

(65) Prior Publication Data

US 2021/0305219 A1  Sep. 30, 2021

(30) Foreign Application Priority Data

Mar. 30, 2020 (JP) .............................. JP2020-060578

(51) Int. Cl.
| | |
|---|---|
| *H01L 33/50* | (2010.01) |
| *H01L 25/075* | (2006.01) |
| *H01L 33/60* | (2010.01) |
| *H01L 33/62* | (2010.01) |

(52) U.S. Cl.
CPC .......... *H01L 25/0753* (2013.01); *H01L 33/50* (2013.01); *H01L 33/60* (2013.01); *H01L 33/62* (2013.01); *H01L 2933/0041* (2013.01); *H01L 2933/0058* (2013.01); *H01L 2933/0066* (2013.01)

(58) Field of Classification Search
CPC .... H01L 33/62; H01L 33/486; H01L 25/0753
See application file for complete search history.

(56) References Cited

U.S. PATENT DOCUMENTS

| | | | | |
|---|---|---|---|---|
| 5,403,781 | A | * | 4/1995 | Matsumoto ......... H01L 21/0276 438/702 |
| 2004/0021160 | A1 | * | 2/2004 | Eguchi ................ H01L 27/0688 257/E21.574 |
| 2008/0122093 | A1 | * | 5/2008 | Hwang ............... H01L 23/5222 438/626 |
| 2008/0173884 | A1 | | 7/2008 | Chitnis et al. |
| 2010/0051984 | A1 | | 3/2010 | West |
| 2013/0248904 | A1 | | 9/2013 | Sugizaki et al. |
| 2014/0191258 | A1 | | 7/2014 | Akimoto et al. |
| 2015/0263242 | A1 | | 9/2015 | Tomizawa et al. |
| 2020/0357781 | A1 | | 11/2020 | Onuma et al. |

FOREIGN PATENT DOCUMENTS

| | | |
|---|---|---|
| JP | 2010-517289 A | 5/2010 |
| JP | 2012-516026 A | 7/2012 |
| JP | 2012-156443 A | 8/2012 |
| JP | 2013-065726 A | 4/2013 |
| JP | 2013-201340 A | 10/2013 |
| JP | 2015-012143 A | 1/2015 |
| JP | 2015-126209 A | 7/2015 |
| JP | 2015-173142 A | 10/2015 |
| JP | 2018-190896 A | 11/2018 |
| WO | WO-2019/092893 A1 | 5/2019 |

\* cited by examiner

*Primary Examiner* — Andrew J Coughlin
(74) *Attorney, Agent, or Firm* — Foley & Lardner LLP

(57) ABSTRACT

A method of manufacturing the light-emitting device includes providing a structure body, mounting the structure body, removing a third substrate region of a silicon substrate of the structure body, disposing a resin layer, disposing a first mask member, removing a first substrate region of the silicon substrate, disposing a first wavelength conversion layer, removing the first mask member, and removing a second substrate region of the silicon substrate.

20 Claims, 38 Drawing Sheets

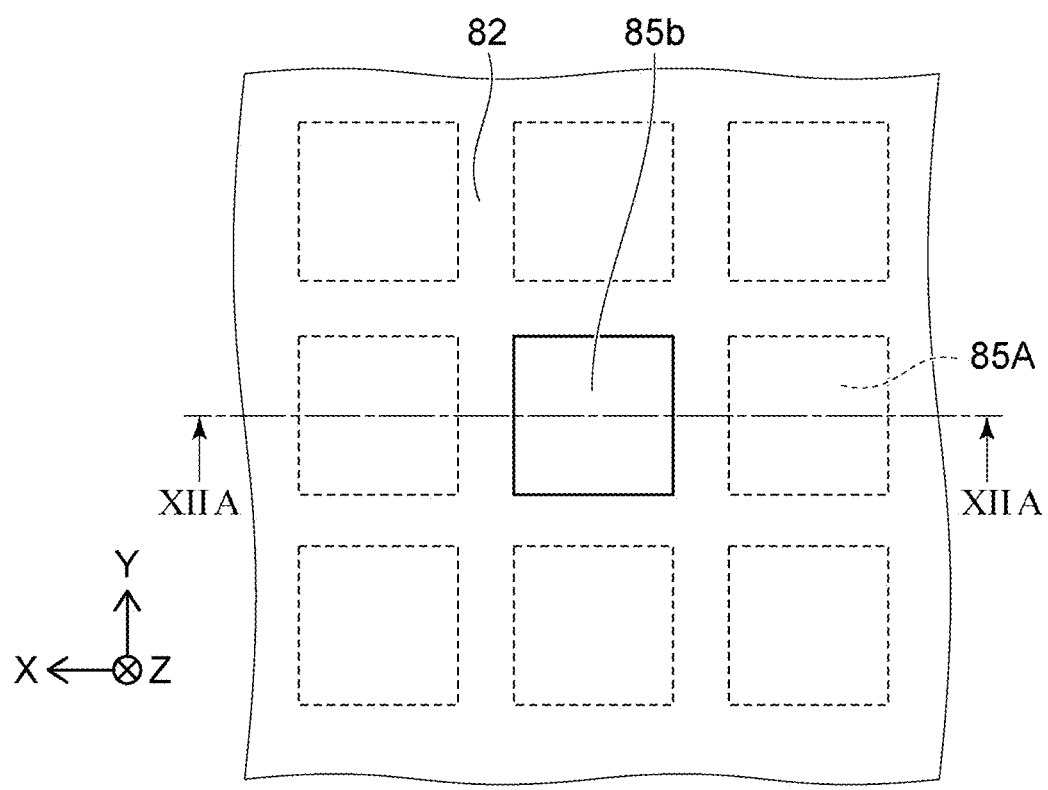
Fig. 1 2 B

METHOD OF MANUFACTURING LIGHT-EMITTING DEVICE

CROSS-REFERENCE TO RELATED APPLICATION

This application is based upon and claims the benefit of priority to Japanese Patent Application No. 2020-060578, filed on Mar. 30, 2020; the entire contents of which are incorporated herein by reference.

BACKGROUND

The present disclosure relates to a method of manufacturing a light-emitting device.

For example, Japanese Patent Publication No. 2012-516026 (a publication of a Japanese National Stage application) describes a method of manufacturing a light source including a step of bonding a plurality of light-emitting semiconductor dies to traces of a substrate.

SUMMARY

In the method of manufacturing according to Japanese Patent Publication No. 2012-516026, a plurality of singulated light-emitting elements are placed on a substrate. However, there is a room for improvement in reduction in variation of the spacing between the light-emitting elements.

According to certain embodiments of the present invention, a method of manufacturing a light-emitting device can be provided in which a plurality of light-emitting elements are densely arranged and variation in the spacing between the light-emitting elements can be reduced.

According to one embodiment, a method of manufacturing the light-emitting device includes providing a structure body that includes: silicon substrate including a first surface in which a groove is formed, a first semiconductor layered body and a second semiconductor layered body that are disposed on the first surface, a first conductive member disposed on the first semiconductor layered body, and a second conductive member disposed on the second semiconductor layered body, the silicon substrate including: a first substrate region facing the first semiconductor layered body, a second substrate region facing the second semiconductor layered body, and a third substrate region located between the first substrate region and the second substrate region, the third substrate region facing the groove; disposing a resin layer in the groove; after the disposing of the resin layer, removing the third substrate region to separate the first substrate region and the second substrate region; after the separating of the first substrate region and the second substrate region, mounting the first semiconductor layered body on a wiring substrate via the first conductive member and mounting the second semiconductor layered body on the wiring substrate via the second conductive member; disposing a first mask member to cover the second substrate region and to expose the first substrate region; removing the first substrate region in a state in which the second substrate region is covered with the first mask member to expose the first semiconductor layered body, forming a first region; disposing a first wavelength conversion layer on the first region; removing the first mask member; and removing the second substrate region to expose the second semiconductor layered body, forming a second region.

BRIEF DESCRIPTION OF THE DRAWINGS

FIG. 12B is a schematic plan view illustrating the step in the method of manufacturing the light-emitting device according to FIG. 12A;

DETAILED DESCRIPTION

Figure 1:
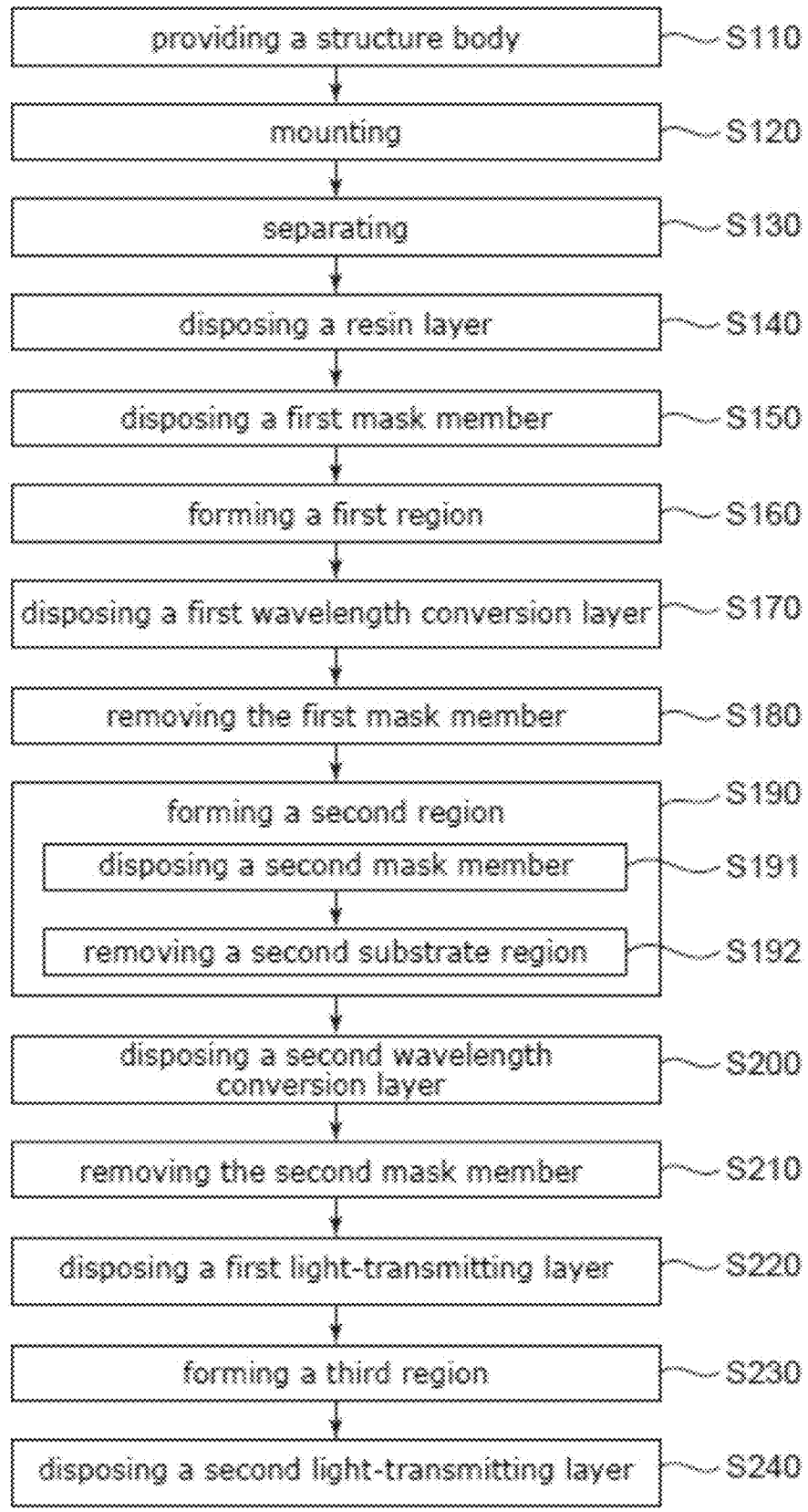
FIG. 1 is a flowchart illustrating a method of manufacturing a light-emitting device according to a first embodiment.

Various embodiments are described below with reference to the accompanying drawings.

The drawings are schematic, to illustrate general concepts of the present disclosure. Therefore, the relationship between a thickness and a width of elements, the proportion of dimension among elements and the like may not coincide with those in actual light source devices. Also, identical portions may appear different in relative dimensions or proportions among the drawings.

In the present specification, an element similar to those already described with reference to drawings will be denoted by an identical reference character, and a detailed description thereof will be omitted as appropriate.

First Embodiment

Figure 2:
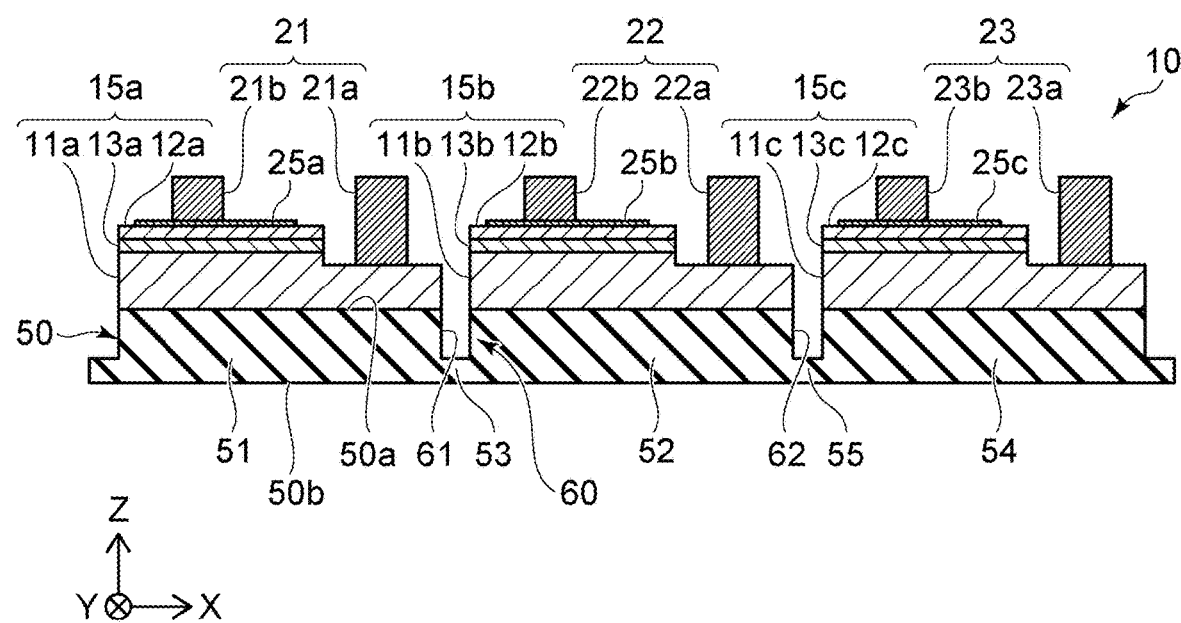
FIG. 2A is a schematic cross-sectional view illustrating a step in the method of manufacturing the light-emitting device according to the first embodiment.
FIG. 2B is a schematic plan view illustrating the step in the method of manufacturing the light-emitting device according to FIG. 2A.

FIG. 1 is a flowchart illustrating a method of manufacturing a light-emitting device according to a first embodiment. Each of FIGS. 2A to 16A is a schematic cross-sectional view illustrating a step in the method of manufacturing the light-emitting device according to the first embodiment. Each of FIGS. 2B to 16B is a schematic plan view illustrating a step in the method of manufacturing the light-emitting device according to the first embodiment. FIGS. 2B to 16B are plan views corresponding respectively to the cross-sectional views of FIGS. 2A to 16A. FIG. 2A corresponds to a cross-section taken along line IIA-IIA of FIG. 2B. Similarly, FIGS. 3A to 16A are cross-sectional views taken along line IIIA-IIIA to line XVIA-XVIA of FIGS. 3B to 16B, respectively.

As shown in FIG. 1, the method of manufacturing the light-emitting device according to the embodiment includes a step S110 of providing a structure body, a step S120 of mounting, a step S130 of separating, a step S140 of disposing a resin layer, a step S150 of disposing a first mask member, a step S160 of forming a first region, a step S170 of disposing a first wavelength conversion layer, a step S180 of removing the first mask member, and a step S190 of forming a second region. The method of manufacturing the light-emitting device according to the embodiment may further include a step S200 of disposing a second wavelength conversion layer, a step S210 of removing the second mask member, a step S220 of disposing a first light-transmitting layer, a step S230 of forming a third region, and a step S240 of disposing a second light-transmitting layer.

Figure 2B:
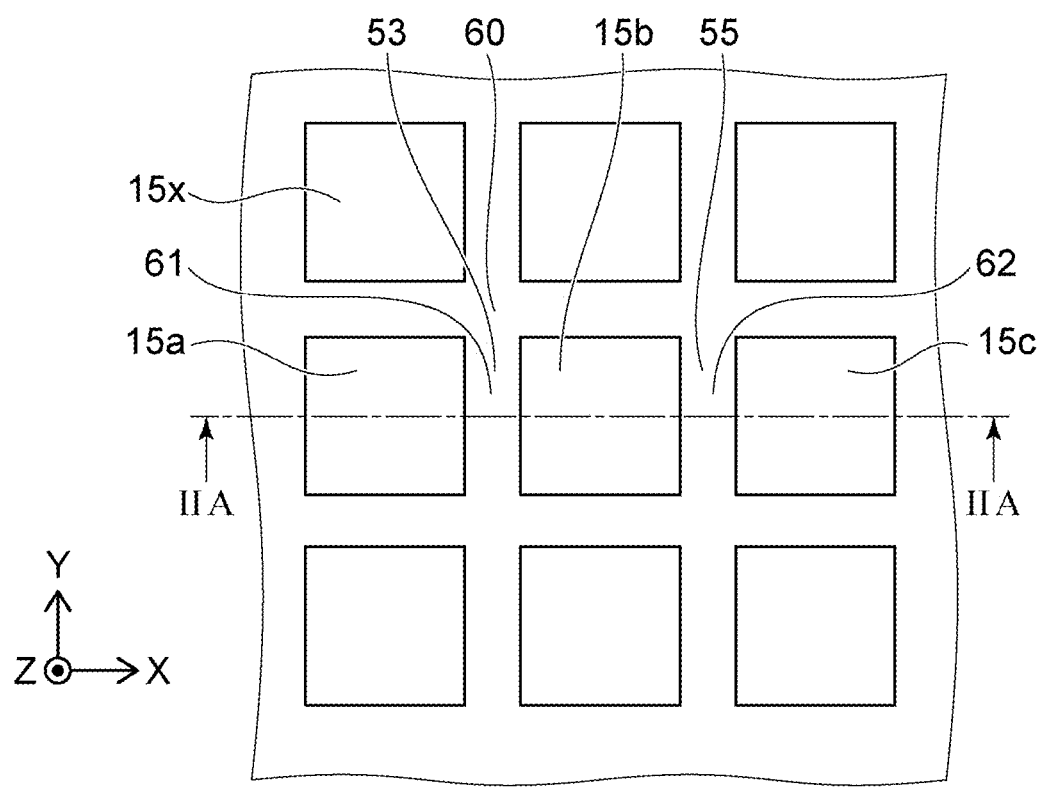

In the step S110 of providing a structure body, a structure body 10 illustrated in FIGS. 2A and 2B is provided. As shown in FIG. 2A, the structure body 10 includes a silicon substrate 50, a first semiconductor layered body 15a, a second semiconductor layered body 15b, a first conductive member 21, and a second conductive member 22. The silicon substrate 50 includes a first surface 50a. A groove 60 (e.g., a first groove 61) is formed in the first surface 50a. The first semiconductor layered body 15a and the second semiconductor layered body 15b are disposed on the first surface 50a. The first conductive member 21 is disposed on the first semiconductor layered body 15a. The second conductive member 22 is disposed on the second semiconductor layered body 15b. The silicon substrate 50 includes a first substrate region 51, a second substrate region 52, and a third substrate region 53. The first substrate region 51 faces the first semiconductor layered body 15a. The second substrate region 52 faces the second semiconductor layered body 15b. The third substrate region 53 is located between the first substrate region 51 and the second substrate region 52. The third substrate region 53 faces the groove 60 (the first groove 61) and is thinner than the first substrate region 51 and the second substrate region 52. The silicon substrate 50 may include a second surface 50b. The second surface 50b is a surface opposite to the first surface 50a.

As shown in FIG. 2A, the direction from the silicon substrate 50 toward the first semiconductor layered body 15a is defined as a Z-axis direction. One direction perpendicular to the Z-axis direction is defined as an X-axis direction. A direction perpendicular to the Z-axis direction and the X-axis direction is defined as a Y-axis direction. The silicon substrate 50 spreads along the X-Y plane. The first surface 50a and the second surface 50b are oriented along the X-Y plane.

FIG. 2B is a plan view of the structure body 10 viewed from a side on which a plurality of semiconductor stacked bodies 15x are provided. As shown in FIG. 2B, the plurality of semiconductor stacked bodies 15x are arranged along the X-Y plane. The first semiconductor layered body 15a, the second semiconductor layered body 15b, a third semiconductor layered body 15c, etc., are included in the plurality of semiconductor stacked bodies 15x. As shown in FIG. 2B, the groove 60 is provided in a lattice configuration between the plurality of semiconductor stacked bodies 15x in a plan view. The conductive members are not illustrated in FIG. 2B.

The first semiconductor layered body 15a includes a semiconductor layer 11a, a semiconductor layer 12a, and an active layer 13a. The semiconductor layer 11a is, for example, an n-type semiconductor layer. The semiconductor layer 12a is, for example, a p-type semiconductor layer. The active layer 13a is disposed between the semiconductor layer 11a and the semiconductor layer 12a. For example, the active layer 13a is disposed on a portion of the semiconductor layer 11a. The semiconductor layer 12a is disposed on the active layer 13a.

As shown in FIG. 2A, the first conductive member 21 includes a conductive portion 21a and a conductive portion 21b. The conductive portion 21a is disposed on a portion of the semiconductor layer 11a. The conductive portion 21b is disposed on the semiconductor layer 12a. The direction from the portion of the semiconductor layer 11a toward the conductive portion 21a is along the Z-axis direction. The direction from the semiconductor layer 12a toward the conductive portion 21b is along the Z-axis direction. The conductive portion 21a is electrically connected to the semiconductor layer 11a. The conductive portion 21b is electrically connected to the semiconductor layer 12a. In this example, a conductive layer 25a is disposed between the semiconductor layer 12a and the conductive portion 21b. The conductive portion 21b is electrically connected to the semiconductor layer 12a via the conductive layer 25a.

The second semiconductor layered body 15b includes a semiconductor layer 11b, a semiconductor layer 12b, and an active layer 13b. The semiconductor layer 11b is, for example, an n-type semiconductor layer. The semiconductor layer 12b is, for example, a p-type semiconductor layer. The active layer 13b is disposed between the semiconductor layer 11b and the semiconductor layer 12b. The active layer 13b is, for example, disposed on a portion of the semiconductor layer 11b. The semiconductor layer 12b is disposed on the active layer 13b.

As shown in FIG. 2A, the second conductive member 22 includes a conductive portion 22a and a conductive portion 22b. The conductive portion 22a is disposed on a portion of the semiconductor layer 11b. The conductive portion 22b is disposed on the semiconductor layer 12b. The direction from the portion of the semiconductor layer 11b toward the conductive portion 22a is along the Z-axis direction. The direction from the semiconductor layer 12b toward the conductive portion 22b is along the Z-axis direction. The conductive portion 22a is electrically connected to the semiconductor layer 11b. The conductive portion 22b is electrically connected to the semiconductor layer 12b. In the example, a conductive layer 25b is disposed between the semiconductor layer 12b and the conductive portion 22b. The conductive portion 22b is electrically connected to the semiconductor layer 12b via the conductive layer 25b.

As shown in FIG. 2A, the silicon substrate 50 may include a fourth substrate region 54 and a fifth substrate region 55. In one example, the second substrate region 52 is located between the first substrate region 51 and the fourth substrate region 54. The fifth substrate region 55 is located between the second substrate region 52 and the fourth substrate region 54. The silicon substrate 50 may include a second groove 62. The second groove 62 may communicate with the first groove 61. The second groove 62 is located between the second substrate region 52 and the fourth substrate region 54. The fifth substrate region 55 faces the second groove 62 and is thinner than the second substrate region 52 and the fourth substrate region 54.

In this example, as shown in FIG. 2A, the structure body 10 includes the third semiconductor layered body 15c and a third conductive member 23. The third semiconductor layered body 15c is disposed on the first surface 50a. The fourth substrate region 54 faces the third semiconductor layered body 15c. The third conductive member 23 is disposed on the third semiconductor layered body 15c.

As shown in FIG. 2A, the third semiconductor layered body 15c includes a semiconductor layer 11c, a semiconductor layer 12c, and an active layer 13c. The semiconductor layer 11c is, for example, an n-type semiconductor layer. The semiconductor layer 12c is, for example, a p-type semiconductor layer. The active layer 13c is disposed between the semiconductor layer 11c and the semiconductor layer 12c. The active layer 13c is, for example, disposed on a portion of the semiconductor layer 11c. The semiconductor layer 12c is disposed on the active layer 13c.

As shown in FIG. 2A, the third conductive member 23 includes a conductive portion 23a and a conductive portion 23b. The conductive portion 23a is disposed on a portion of the semiconductor layer 11c. The conductive portion 23b is disposed on the semiconductor layer 11c. For example, the direction from the portion of the semiconductor layer 11c toward the conductive portion 23a is along the Z-axis direction. The direction from the semiconductor layer 12c toward the conductive portion 23b is along the Z-axis direction. The conductive portion 23a is electrically connected to the semiconductor layer 11c. The conductive portion 23b is electrically connected to the semiconductor layer 12c. In the example, a conductive layer 25c is disposed between the semiconductor layer 12c and the conductive portion 23b. The conductive portion 23b is electrically connected to the semiconductor layer 12c via the conductive layer 25c.

In the step S120 of mounting, as shown in FIG. 3A, the structure body 10 is mounted on a wiring substrate 70 via the first conductive member 21 and the second conductive member 22. In the example, the structure body 10 also is mounted on the wiring substrate 70 via the third conductive member 23. For example, the structure body 10 is mounted on the wiring substrate 70 via the conductive portion 21a, the conductive portion 21b, the conductive portion 22a, the conductive portion 22b, the conductive portion 23a, and the conductive portion 23b. In the example, the wiring substrate 70 is provided with wiring layers 71 and 72. For example, the conductive portion 21b and the conductive portion 22a are electrically connected to each other by the wiring layer 71, and the conductive portion 22b and the conductive portion 23a are electrically connected to each other by the wiring layer 72. Each wiring layer is not necessarily disposed to electrically connect adjacent semiconductor stacked bodies together. When each wiring layer does not electrically connect adjacent semiconductor stacked bodies, the semiconductor stacked bodies can be individually caused to emit light.

Figure 3:
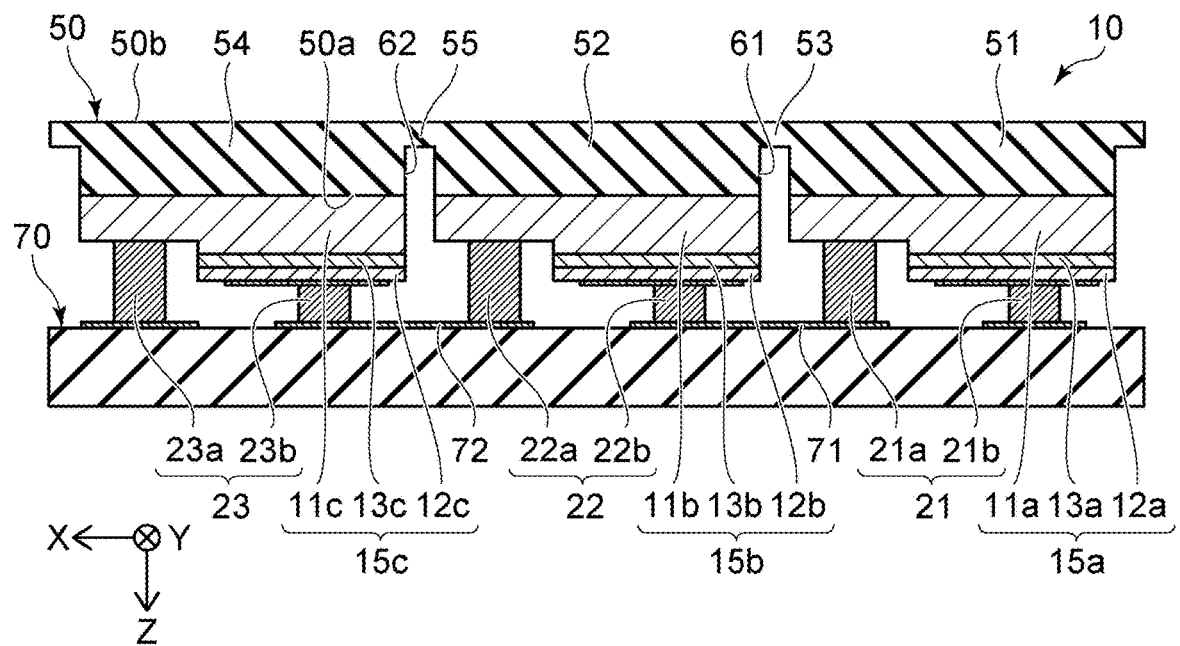
FIG. 3A is a schematic cross-sectional view illustrating a step in the method of manufacturing the light-emitting device according to the first embodiment.
FIG. 3B is a schematic plan view illustrating the step in the method of manufacturing the light-emitting device according to FIG. 3A.
Figure 3B:
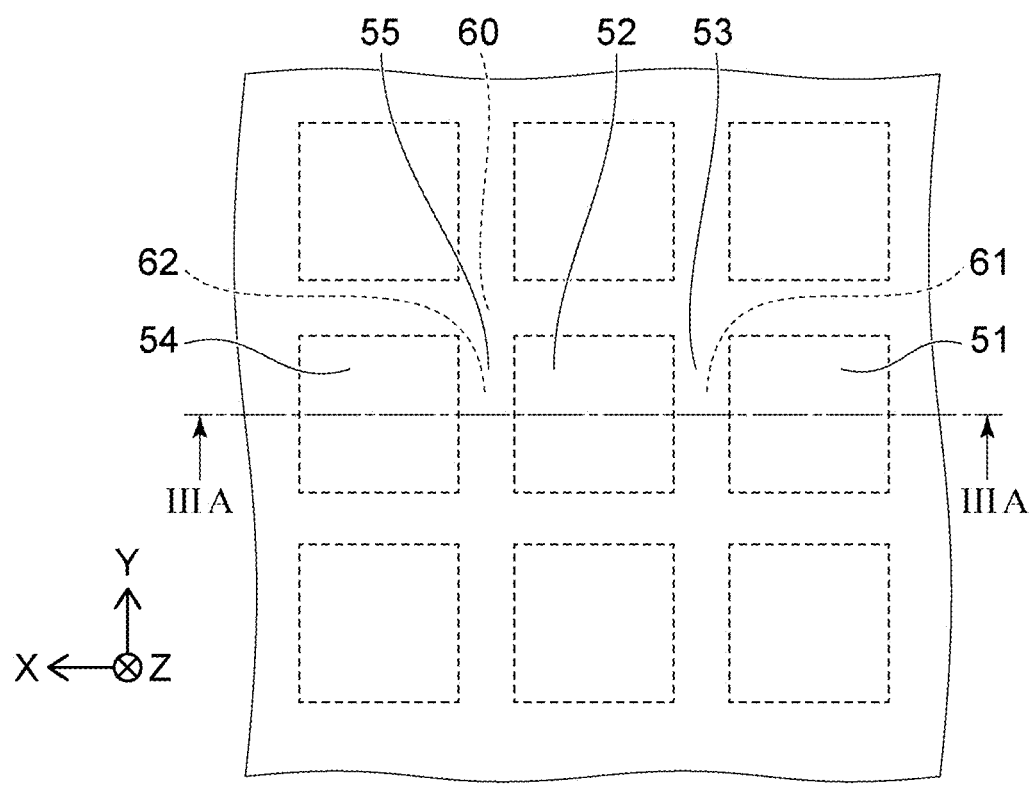
Figure 4:
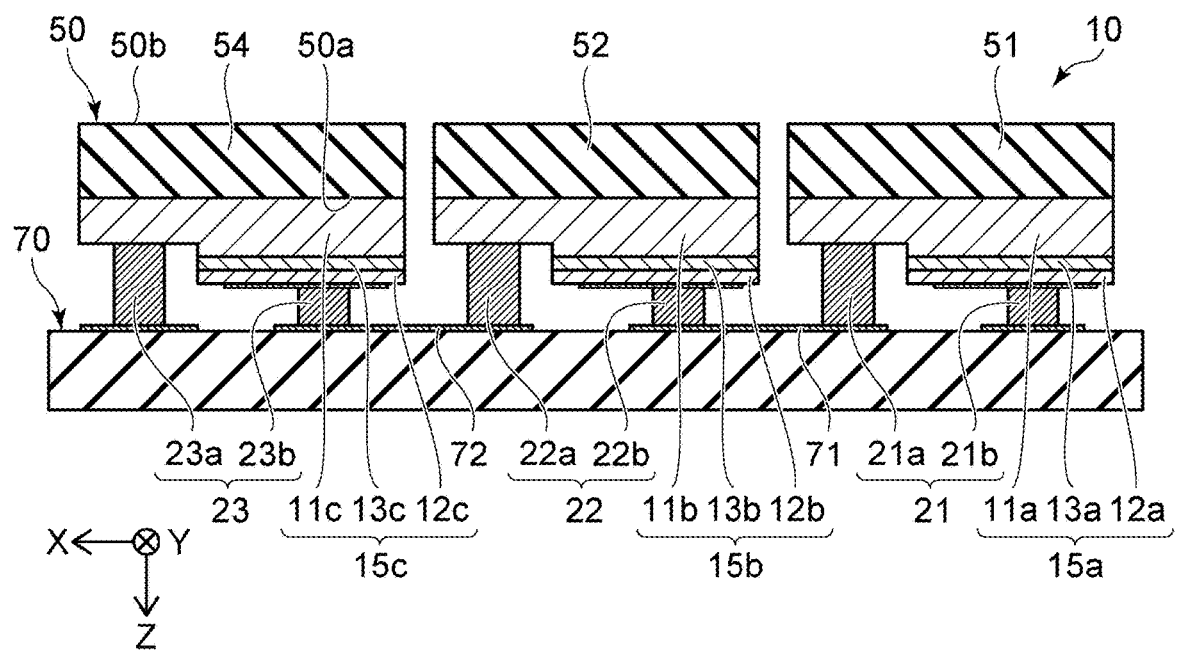
FIG. 4A is a schematic cross-sectional view illustrating a step in the method of manufacturing the light-emitting device according to the first embodiment.
FIG. 4B is a schematic plan view illustrating the step in the method of manufacturing the light-emitting device according to FIG. 4A.
Figure 4:
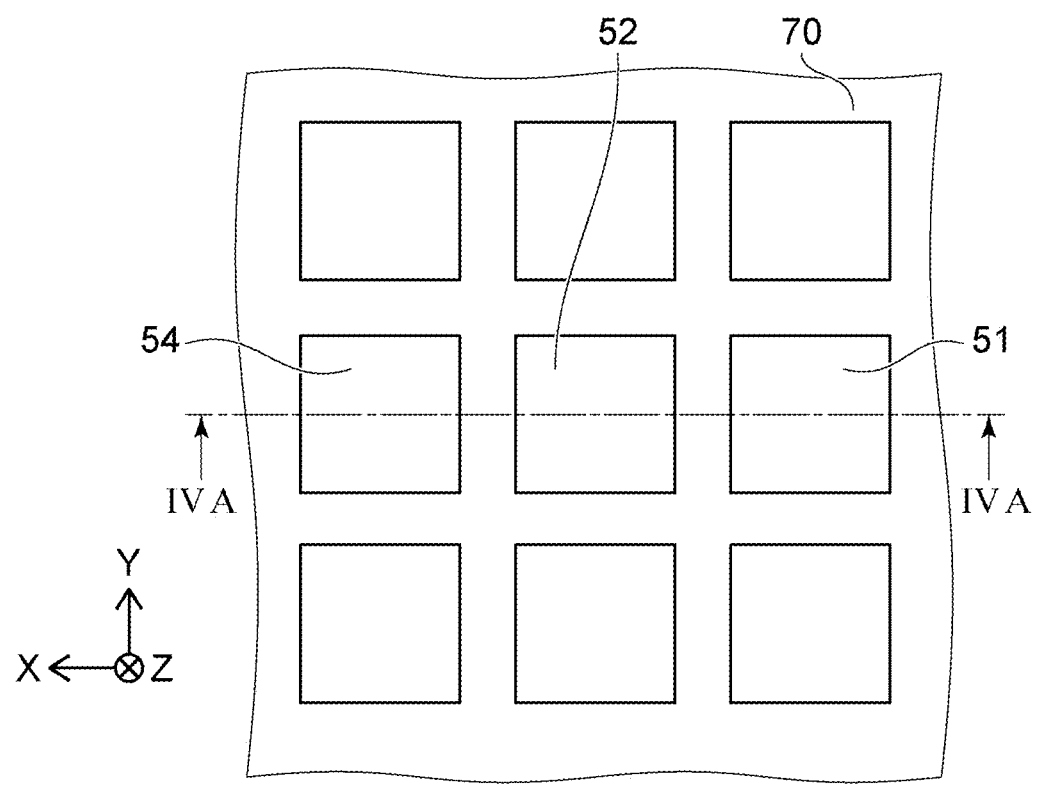

In the step S120 of mounting, as shown in FIG. 3B, the mounting on the wiring substrate 70 is performed in a state in which the third substrate region 53 is located between the first substrate region 51 and the second substrate region 52, and the fifth substrate region 55 is located between the second substrate region 52 and the fourth substrate region 54.

After the structure body 10 is mounted on the wiring substrate 70, in the step S130 of separating, as shown in FIG.

4A, the third substrate region 53 is removed to separate the first substrate region 51 and the second substrate region 52. In this example, the fifth substrate region 55 is also removed to also separate the second substrate region 52 and the fourth substrate region 54. In the removal of the third substrate region 53 and the fifth substrate region 55, for example, the third substrate region 53 and the fifth substrate region 55 are removed from the second surface 50b side of the silicon substrate 50. The removal of these substrate regions is performed by, for example, polishing, dry etching, wet etching, etc. Removal of the third substrate region 53 causes separation (i.e., a gap) between the first substrate region 51 and the second substrate region 52. Removal of the fifth substrate region 55 causes separation (i.e., a gap) between the second substrate region 52 and the fourth substrate region 54.

In the step S130 of separating as shown in FIG. 4B, in a plan view, the first substrate region 51 and the second substrate region 52 are separated, and the second substrate region 52 and the fourth substrate region 54 are separated. The wiring layers are not illustrated in FIG. 4B.

In the step S140 of disposing a resin layer as shown in FIG. 5A, a resin layer 80 is disposed between the first substrate region 51 and the second substrate region 52. In the example, the resin layer 80 is also located between the second substrate region 52 and the fourth substrate region 54. Examples of a resin used for the resin layer 80 include an epoxy resin and a silicone resin. The resin layer 80 may include, for example, light-reflective particles so that the light emitted from the semiconductor stacked bodies is extracted efficiently to the outside.

Figure 5:
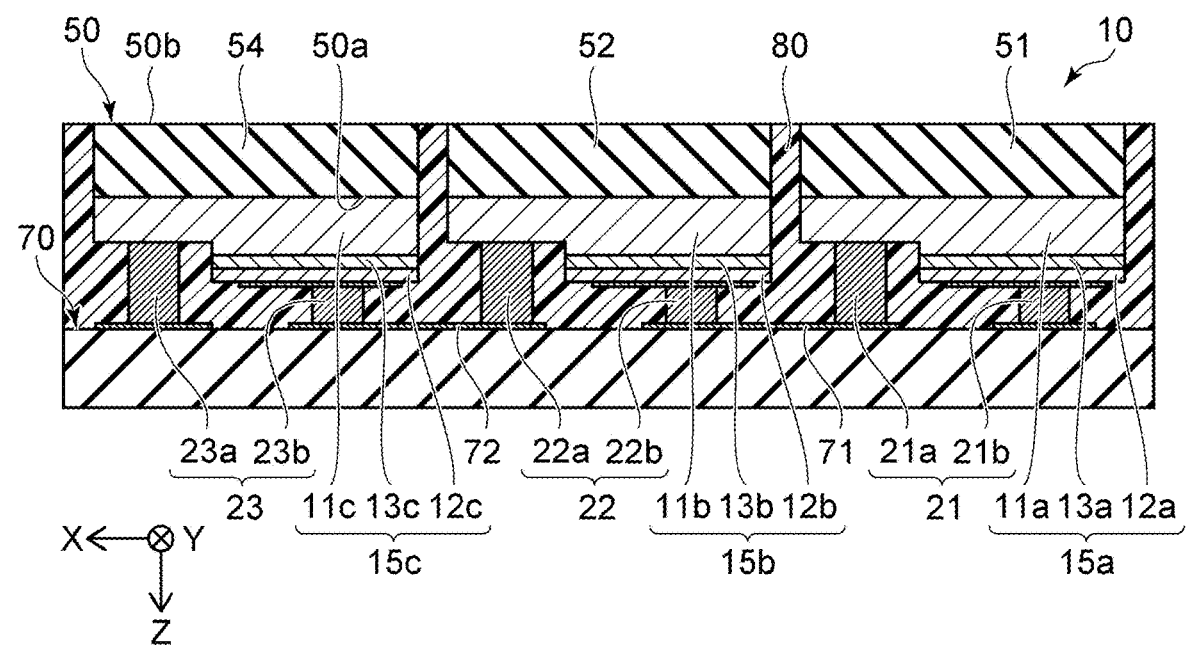
FIG. 5A is a schematic cross-sectional view illustrating a step in the method of manufacturing the light-emitting device according to the first embodiment.
FIG. 5B is a schematic plan view illustrating the step in the method of manufacturing the light-emitting device according to FIG. 5A.
Figure 5B:
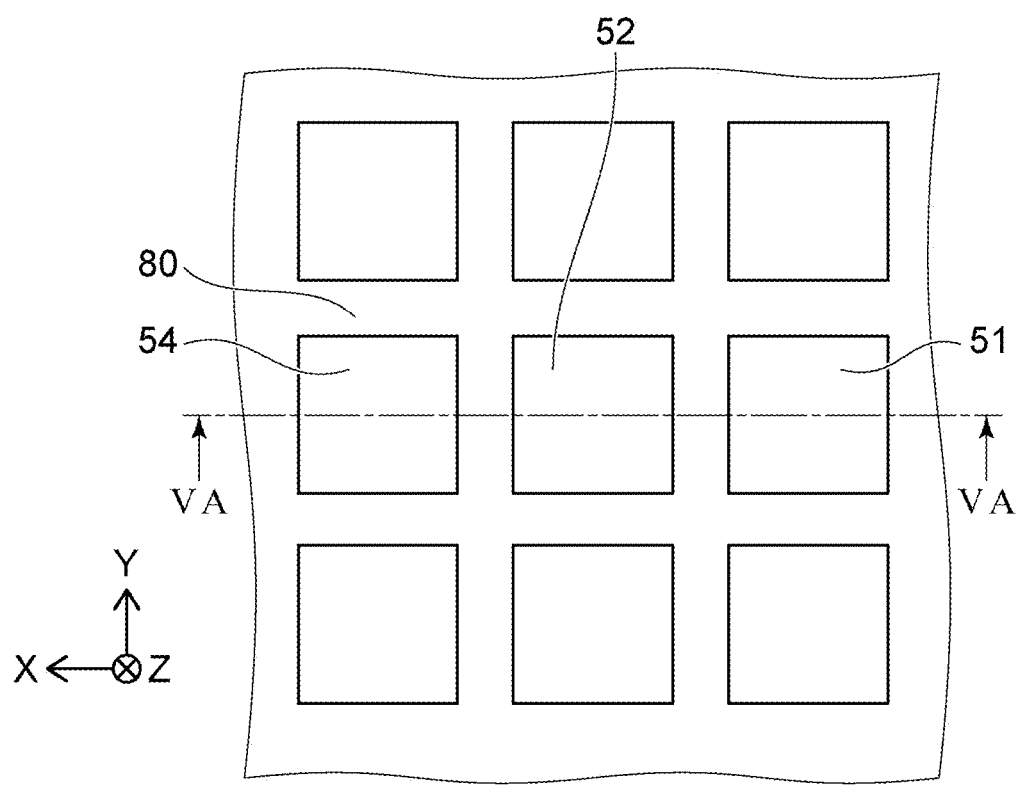
Figure 6:
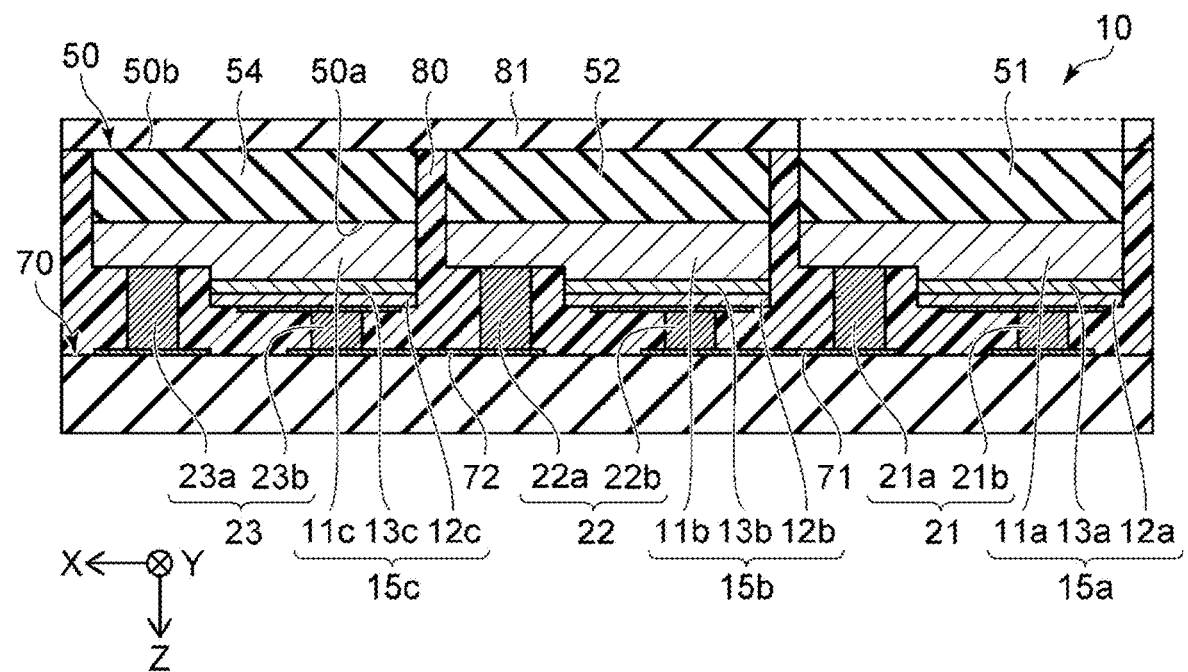
FIG. 6A is a schematic cross-sectional view illustrating a step in the method of manufacturing the light-emitting device according to the first embodiment.
FIG. 6B is a schematic plan view illustrating the step in the method of manufacturing the light-emitting device according to FIG. 6A.
Figure 6:
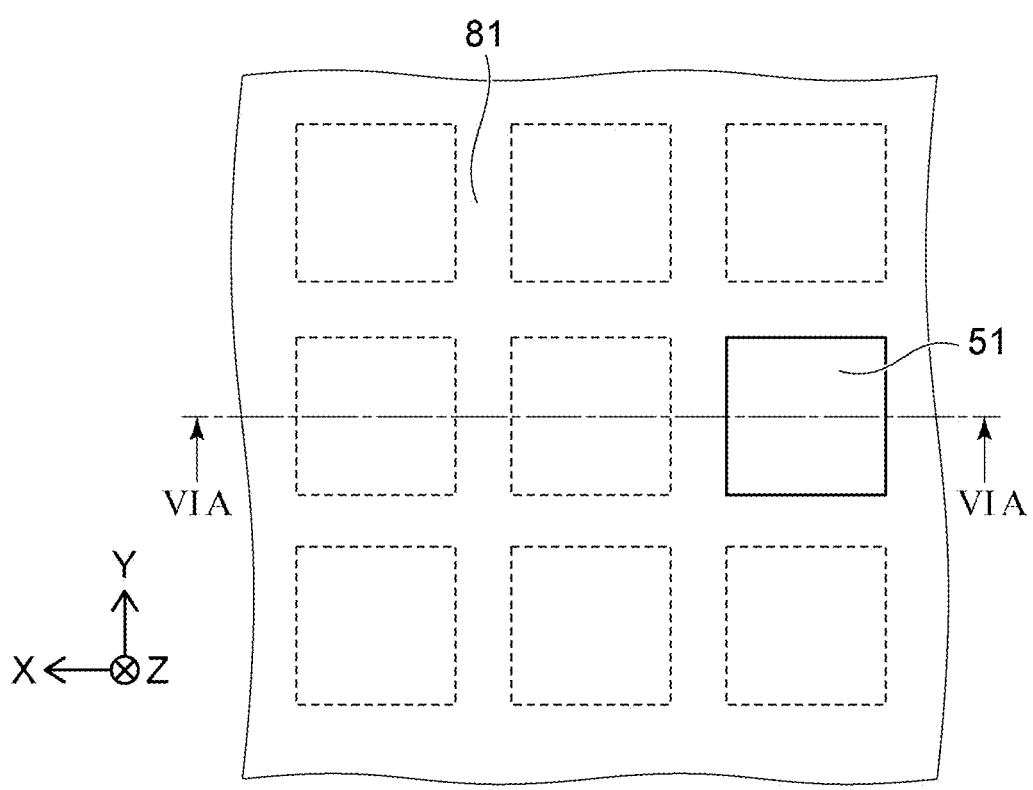

In the step S140 of disposing a resin layer as shown in FIG. 5B, the resin layer 80 is disposed between the first substrate region 51 and the second substrate region 52 in a plan view.

As shown in FIG. 6A, a first mask member 81 is disposed in the step S150 of disposing a first mask member. The first mask member 81 covers the second substrate region 52. In this example, the first mask member 81 also covers the resin layer 80. In this example, the first mask member 81 also covers the fourth substrate region 54. The first mask member 81 causes the first substrate region 51 to be exposed. For the first mask member 81, for example, a resin, an inorganic insulating film, etc., can be used. For example, techniques such as photolithography or the like is used to pattern the first mask member 81. The first mask member 81 has a thickness, for example, in a range of about 10 µm to 1000 µm.

In the step S150 of disposing a first mask member, as shown in FIG. 6B, in a plan view, the first mask member 81 is disposed to cover the resin layer 80, the second substrate region 52, and the fourth substrate region 54 and to expose the first substrate region 51.

In the step S160 of forming a first region, as shown in FIG. 7A, the first substrate region 51 is removed in a state in which the second substrate region 52 is covered with the first mask member 81 to expose the first semiconductor layered body 15a, so that a first region 15A is formed. The removal of the first substrate region 51 is performed by wet etching, dry etching, etc. In a top plan view, the first region 15A corresponds to at least a portion of the first semiconductor layered body 15a (e.g., the portion of the semiconductor layer 11a exposed from the resin layer 80). In this example, the fourth substrate region 54 and the resin layer 80 are covered with the first mask member 81 in the step S160 of forming a first region.

Figure 7:
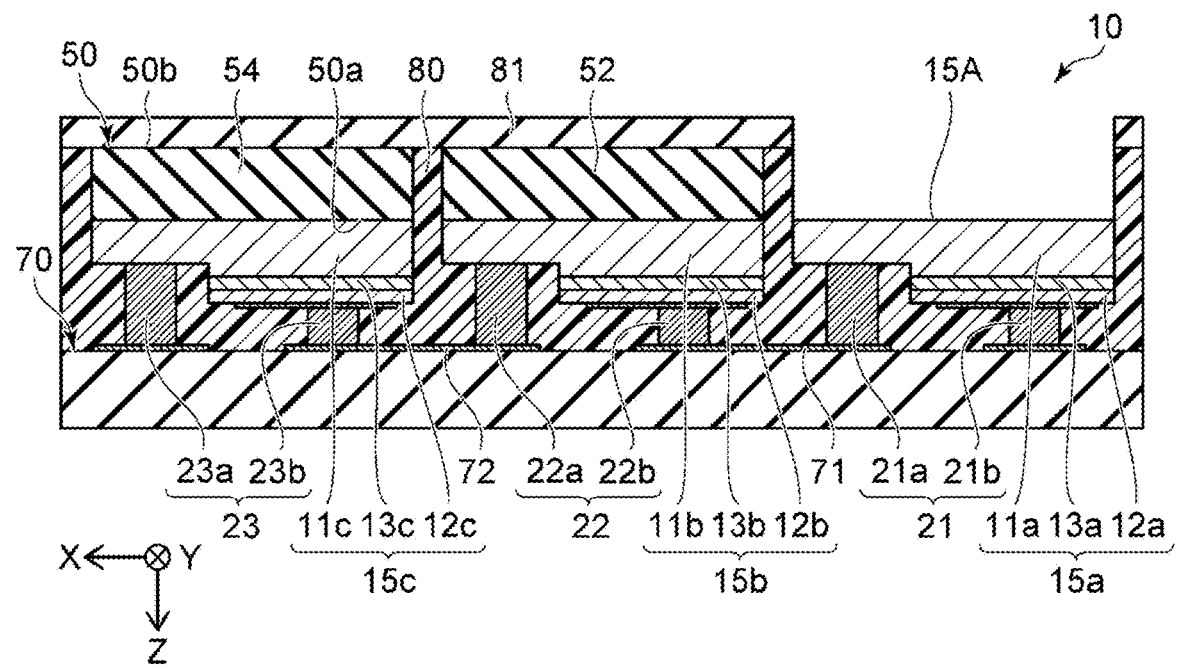
FIG. 7A is a schematic cross-sectional view illustrating a step in the method of manufacturing the light-emitting device according to the first embodiment.
FIG. 7B is a schematic plan view illustrating the step in the method of manufacturing the light-emitting device according to FIG. 7A.
Figure 7B:
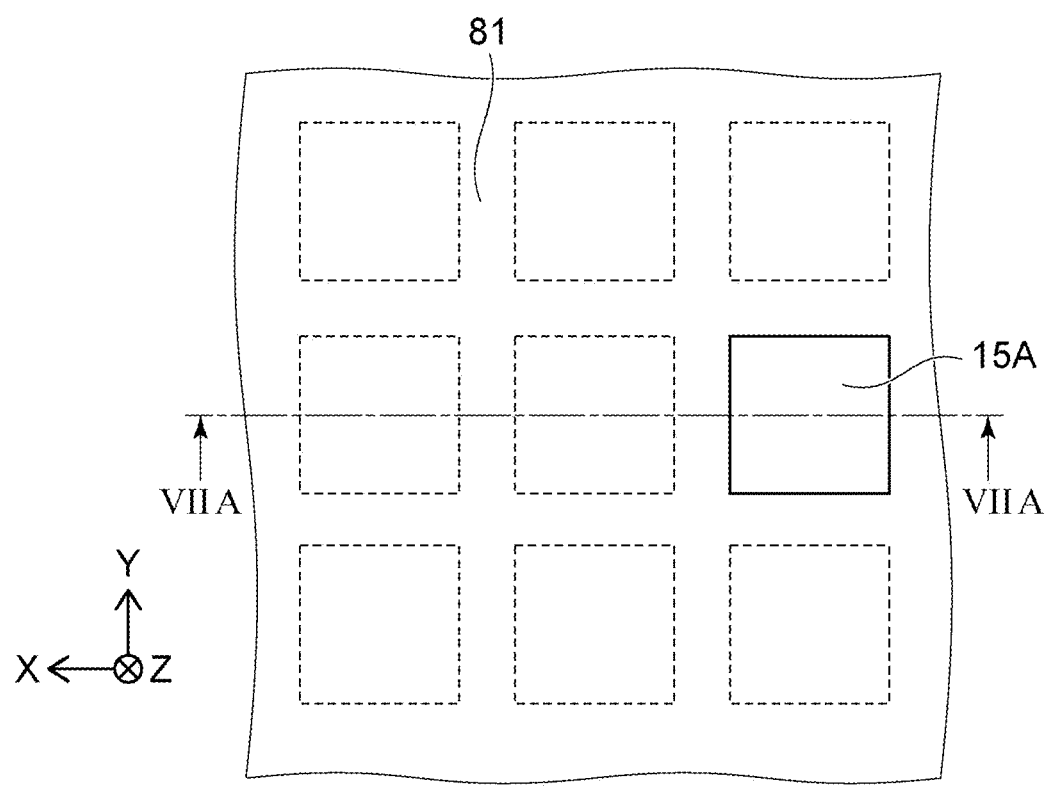

In the step S160 of forming a first region, as shown in FIG. 7B, the first substrate region 51 is removed to expose the first semiconductor layered body 15a, so that the first region 15A is formed.

In the step S170 of disposing a first wavelength conversion layer, as shown in FIG. 8A, a first wavelength conversion layer 85A is disposed on the first region 15A. For example, the first wavelength conversion layer 85A can be disposed by coating, electrodeposition, etc. When the first wavelength conversion layer 85A is disposed by coating, after coating the first wavelength conversion layer 85A over the first region 15A and the upper surface of the first mask member 81, the first wavelength conversion layer 85A on the upper surface of the first mask member 81 may be removed together with removing the first mask member in the step S180 of removing the first mask member described below, so that the first wavelength conversion layer 85A can be selectively disposed on the first region 15A. Also, when the first wavelength conversion layer 85A is disposed by coating, the first wavelength conversion layer 85A of the upper surface of the first mask member 81 may be removed by polishing after coating the first wavelength conversion layer 85A over the first region 15A and the upper surface of the first mask member 81. Disposing the first wavelength conversion layer 85A using a technique such as electrodeposition, etc., allows for facilitating selectively disposing the first wavelength conversion layer 85A on the first region 15A. The first wavelength conversion layer 85A includes, for example, fluorescent material particles and a resin. The first wavelength conversion layer 85A has a thickness, for example, in a range of 50 µm to 500 µm.

Figure 8:
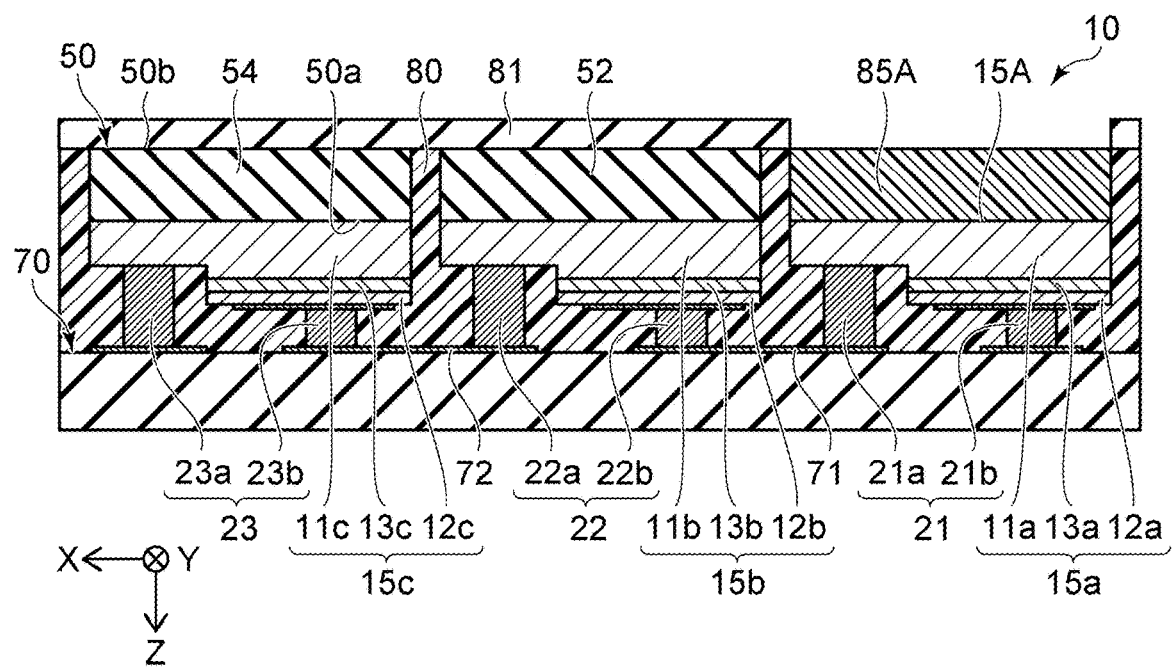
FIG. 8A is a schematic cross-sectional view illustrating a step in the method of manufacturing the light-emitting device according to the first embodiment.
FIG. 8B is a schematic plan view illustrating the step in the method of manufacturing the light-emitting device according to FIG. 8A.
Figure 8B:
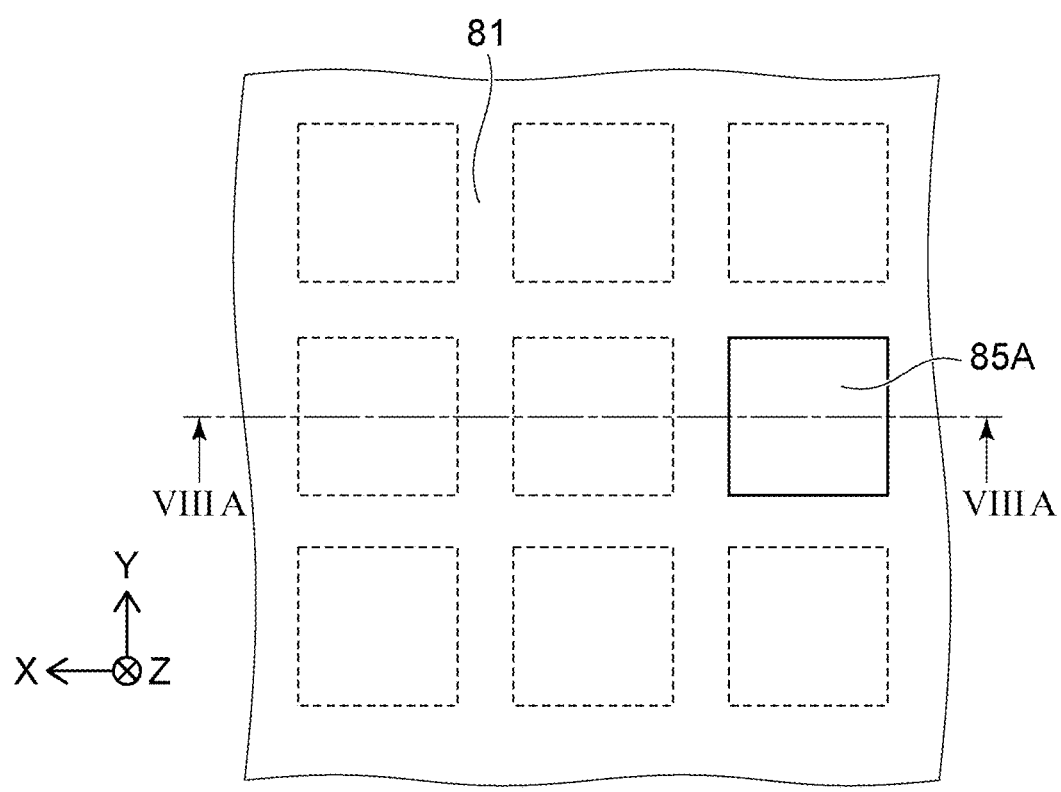

In the step S170 of disposing a first wavelength conversion layer, as shown in FIG. 8B, the first wavelength conversion layer 85A is disposed on the first region 15A.

As shown in FIG. 9A, the first mask member 81 is removed in the step S180 of removing the first mask member. For example, when the first mask member 81 includes a resist, the first mask member 81 can be removed by dry etching, wet etching, etc.

Figure 9:
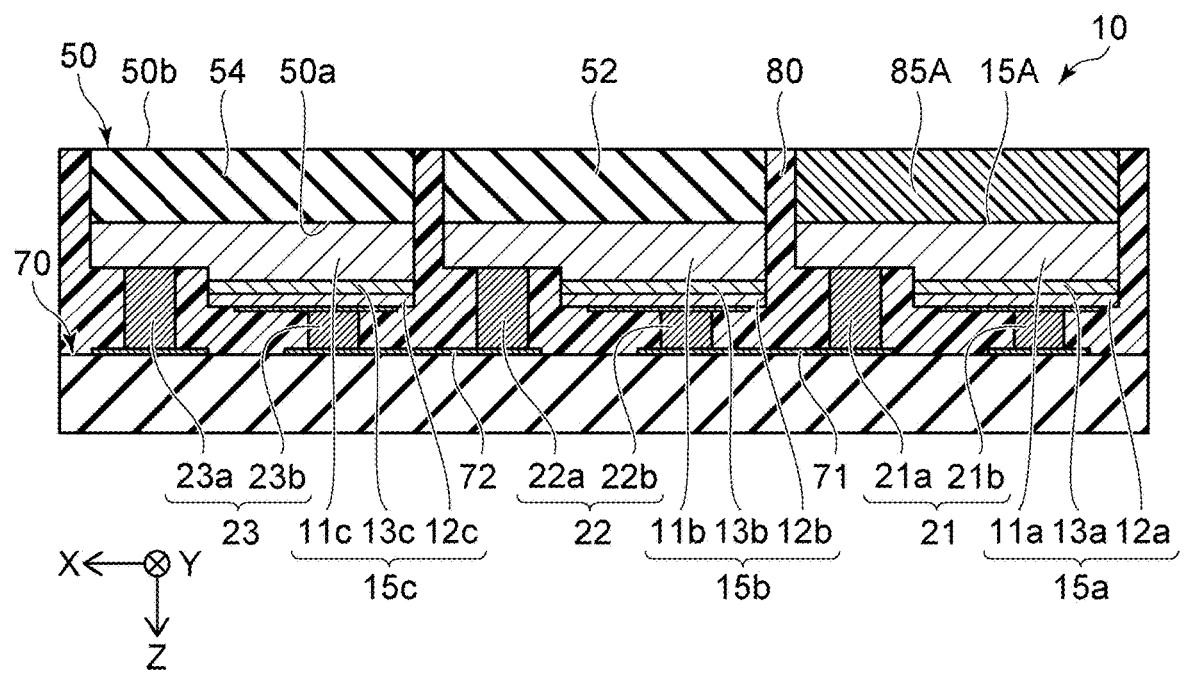
FIG. 9A is a schematic cross-sectional view illustrating a step in the method of manufacturing the light-emitting device according to the first embodiment.
FIG. 9B is a schematic plan view illustrating the step in the method of manufacturing the light-emitting device according to FIG. 9A.
Figure 9B:
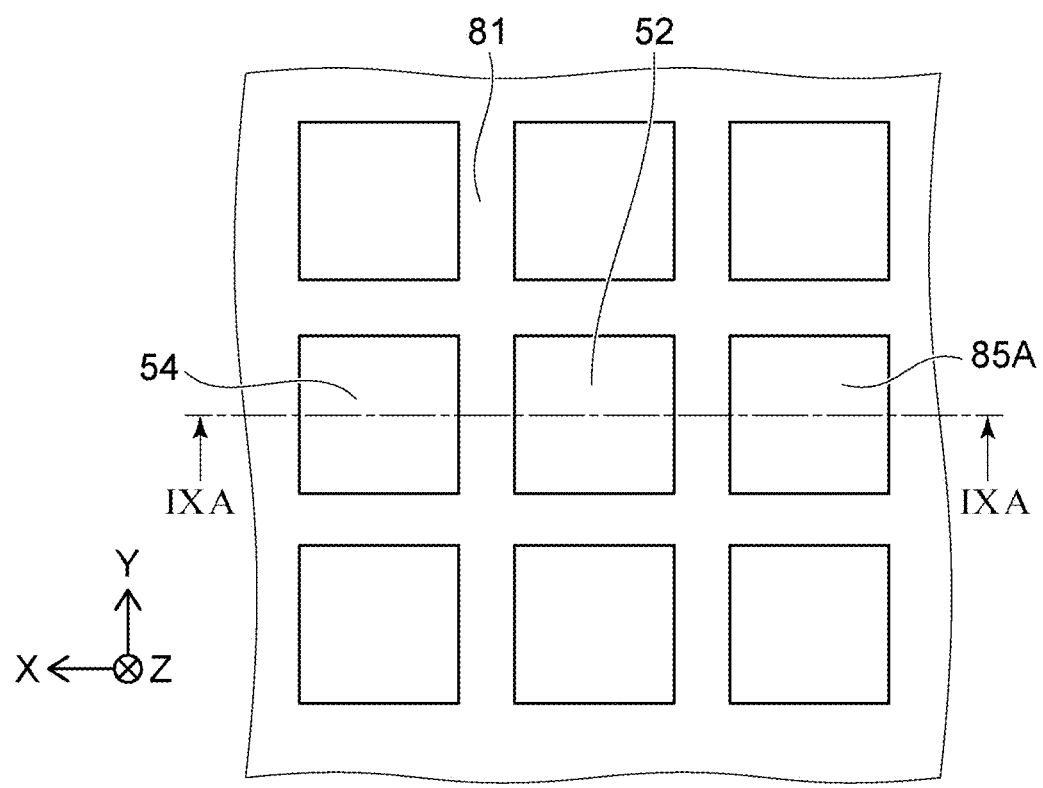

In the step S180 of removing the first mask member, as shown in FIG. 9B, the first mask member 81 is removed to expose the second substrate region 52 and the fourth substrate region 54.

In the step S190 of forming a second region, the second substrate region 52 is removed to expose the second semiconductor layered body 15b, so that a second region 15B is formed. In a top view, the second region 15B corresponds to at least a portion of the second semiconductor layered body 15b (e.g., the portion of the semiconductor layer 11b exposed from the resin layer 80).

In the method of manufacturing the light-emitting device according to the present embodiment, the structure body 10 in which the plurality of semiconductor stacked bodies 15x (e.g., the first semiconductor layered body 15a, the second semiconductor layered body 15b, etc.) are provided is mounted on the wiring substrate 70. Subsequently, a portion of the silicon substrate 50 (e.g., the third substrate region 53) is removed to singulate into the plurality of semiconductor stacked bodies 15x. In the present embodiment, the plurality of semiconductor stacked bodies 15x can be mounted on the wiring substrate 70 collectively in a state in which the positions of the plurality of semiconductor stacked bodies 15x regulated in the structure body 10.

In the case in which the light-emitting elements are picked up one at a time so as to mount the plurality of light-emitting elements onto the wiring substrate, depending on the accuracy of the device used for the mounting, there is room for improvement in densely arranging the light-emitting elements and having constant intervals between the light-emitting elements. In the present embodiment, as described above, the plurality of semiconductor stacked bodies 15x can be mounted on the wiring substrate 70 collectively in a state in which the semiconductor stacked bodies 15x maintains in position on the silicon substrate, which is the growth substrate. Accordingly, on the wiring substrate, the plurality of semiconductor stacked bodies 15x can be densely arranged, and the variation in the intervals between the plurality of semiconductor stacked bodies 15x can be reduced. Accordingly, according to the embodiment, a method of manufacturing a light-emitting device can be provided in which the plurality of light-emitting elements can be densely arranged and the variation in the spacing between the light-emitting elements can be reduced. The expression "reduce the variation in the spacing between the light-emitting elements" refers to that, for example, variation in the spacing between the light-emitting elements is 3 µm or less. Also, the expression "densely arrange the light-emitting elements" refers to, for example, the intervals between the light-emitting elements being 100 µm or less.

In the embodiment described above, the first wavelength conversion layer 85A is selectively disposed on the first region 15A. The first wavelength conversion layer 85A is not disposed on the second region 15B. For example, the wavelength of the light emitted from the first semiconductor layered body 15a is converted by passing through the first wavelength conversion layer 85A. On the other hand, the light that is emitted from the second semiconductor layered body 15b is emitted to the outside without being wavelength-converted. Even when the wavelength distribution of the light emitted from the first semiconductor layered body 15a is the same as the wavelength distribution of the light emitted from the second semiconductor layered body 15b, light of different colors is obtained by varying whether or not the light passes through the first wavelength conversion layer 85A.

In the present embodiment, as described below, the step S190 of forming a second region may include a step S191 of disposing a second mask member and a step S192 of removing a second substrate region illustrated in FIG. 1.

Figure 10A:
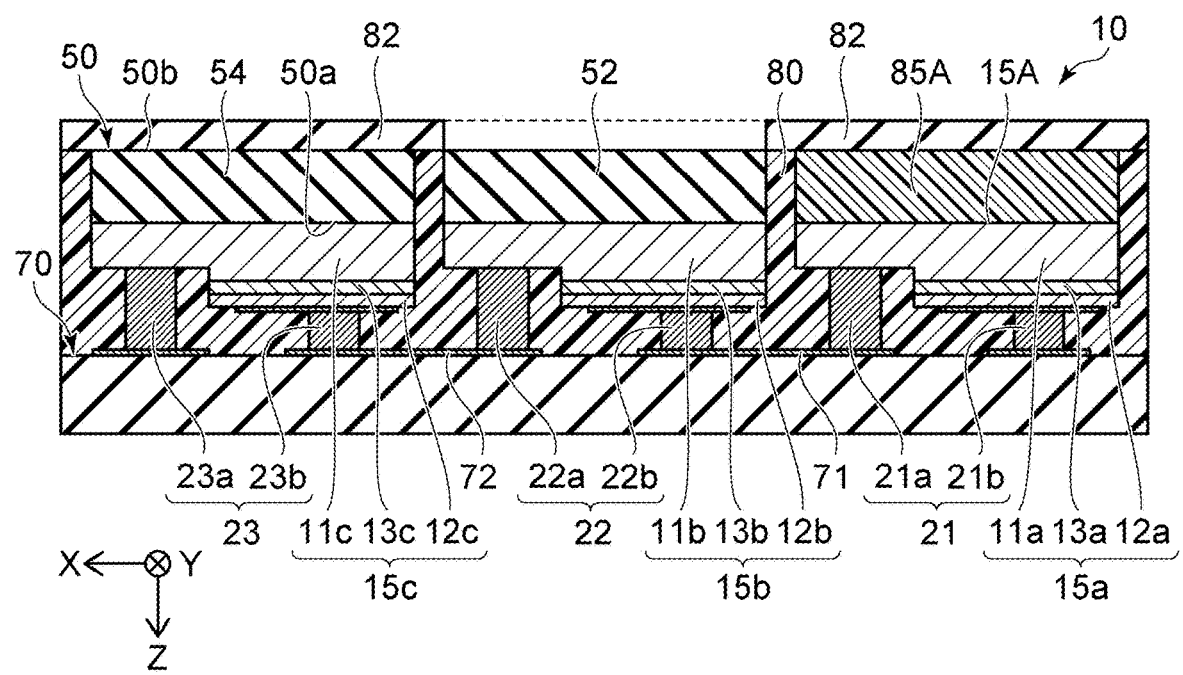
FIG. 10A is a schematic cross-sectional view illustrating a step in the method of manufacturing the light-emitting device according to the first embodiment.
Figure 10B:
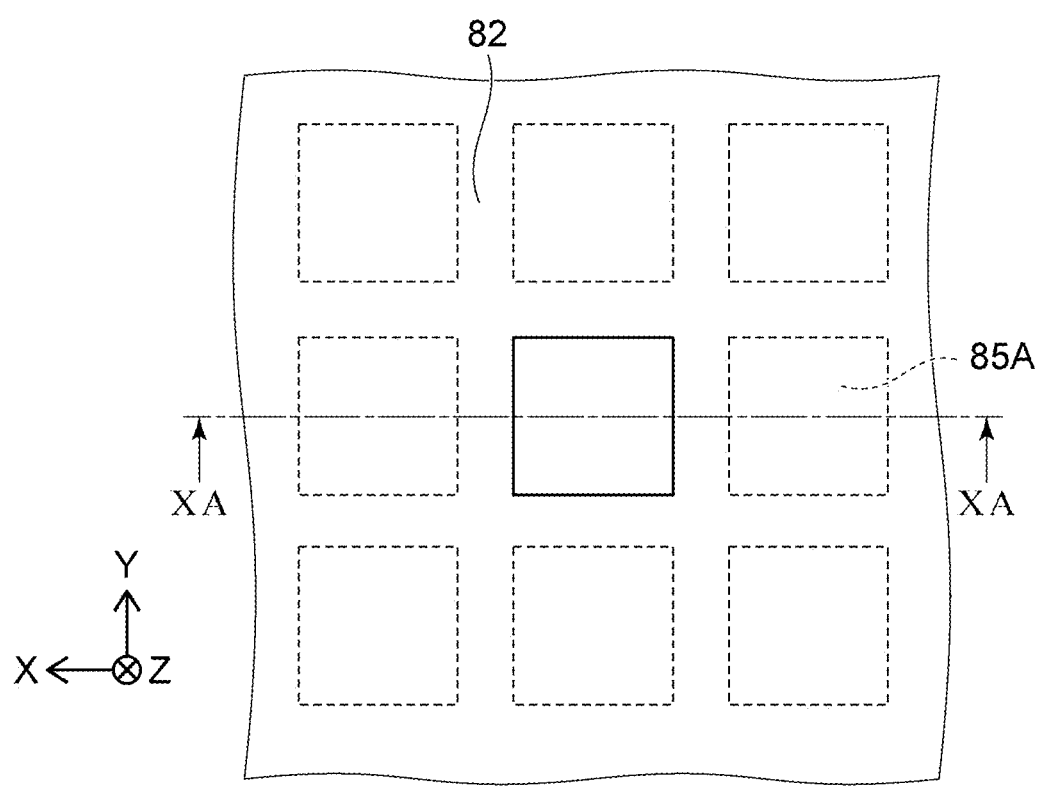
FIG. 10B is a schematic plan view illustrating the step in the method of manufacturing the light-emitting device according to FIG. 10A.

In the step S191 of forming a second mask member as shown in FIGS. 10A and 10B, a second mask member 82 is disposed to cover the first wavelength conversion layer 85A and to expose the second substrate region 52. In the example, the second mask member 82 also covers the fourth substrate region 54 in the step S191 of disposing a second mask member. The second mask member 82 can have a thickness approximately equal to a thickness of the first mask member 81.

Figure 11A:
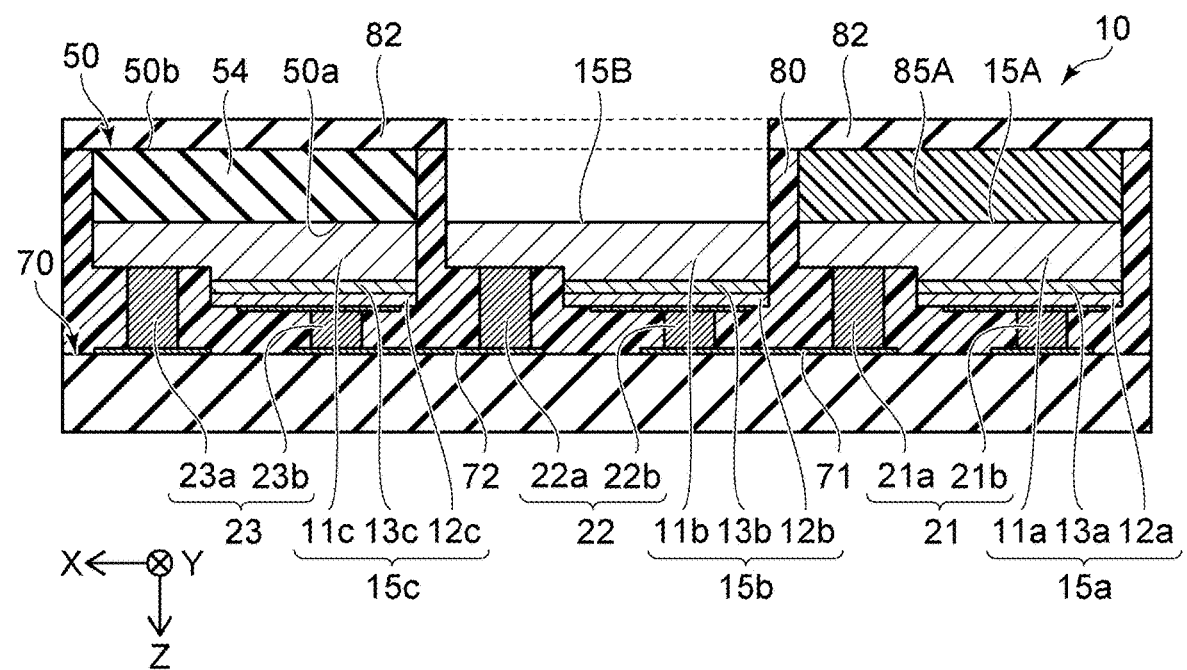
FIG. 11A is a schematic cross-sectional view illustrating a step in the method of manufacturing the light-emitting device according to the first embodiment.
Figure 11B:
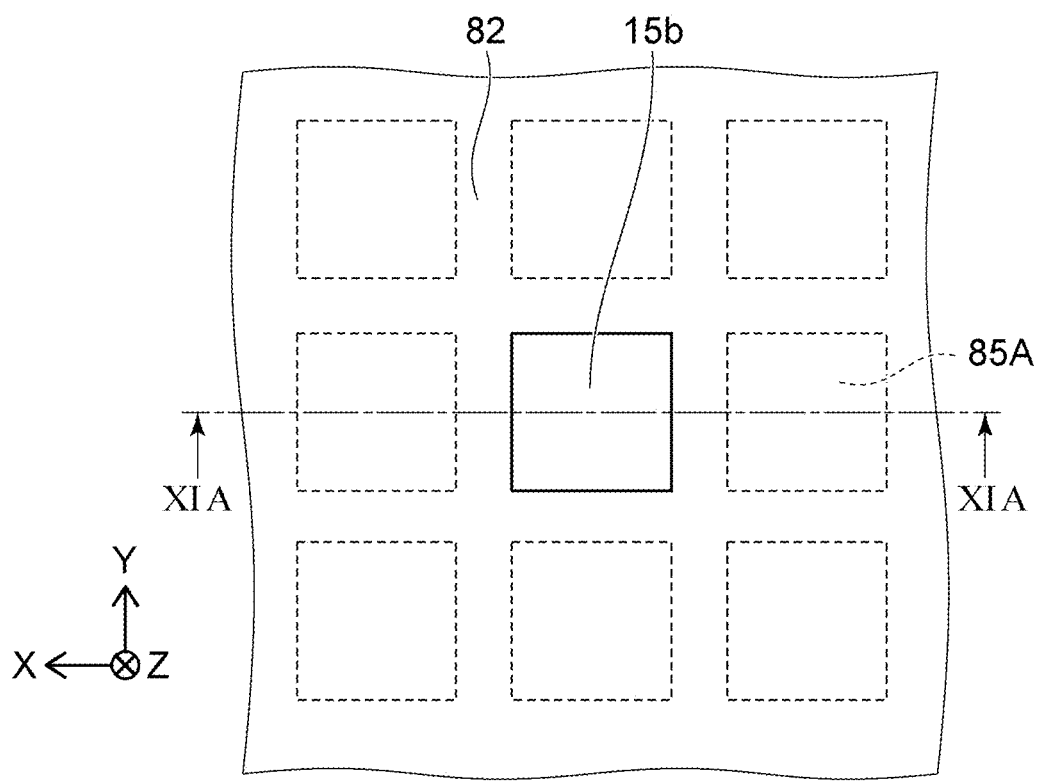
FIG. 11B is a schematic plan view illustrating the step in the method of manufacturing the light-emitting device according to FIG. 11A.

In the step S192 of removing a second substrate region, as shown in FIGS. 11A and 11B, the second substrate region 52 is removed in a state in which the first wavelength conversion layer 85A is covered with the second mask member 82. The removal of the second substrate region 52 is performed by wet etching, dry etching, etc. Among these, the second substrate region 52 can be selectively removed by performing dry etching.

Figure 12A:
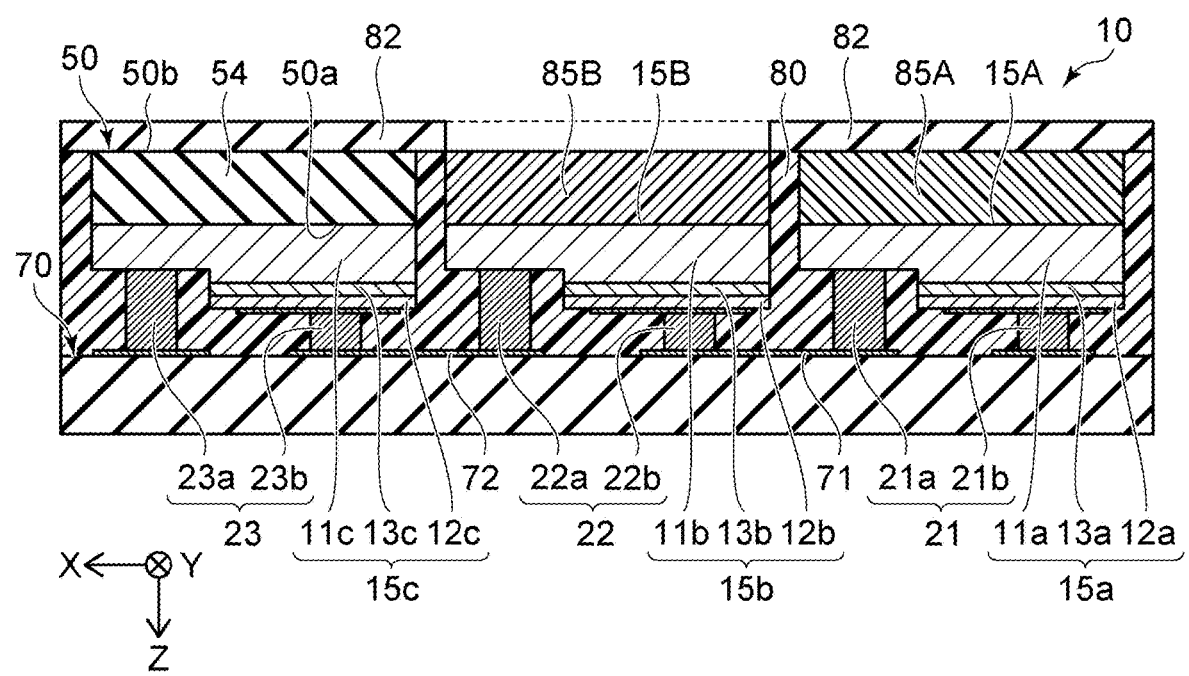
FIG. 12A is a schematic cross-sectional view illustrating a step in the method of manufacturing the light-emitting device according to the first embodiment.

In the step S200 of disposing a second wavelength conversion layer illustrated in FIG. 1, a second wavelength conversion layer 85B is disposed on the second region 15B as shown in FIGS. 12A and 12B. For example, the peak wavelength of light emitted from the second wavelength conversion layer 85B is different from the peak wavelength of light emitted from the first wavelength conversion layer 85A. The type of the fluorescent material contained in the second wavelength conversion layer 85B is different from the type of the fluorescent material contained in the first wavelength conversion layer 85A.

Figure 13A:
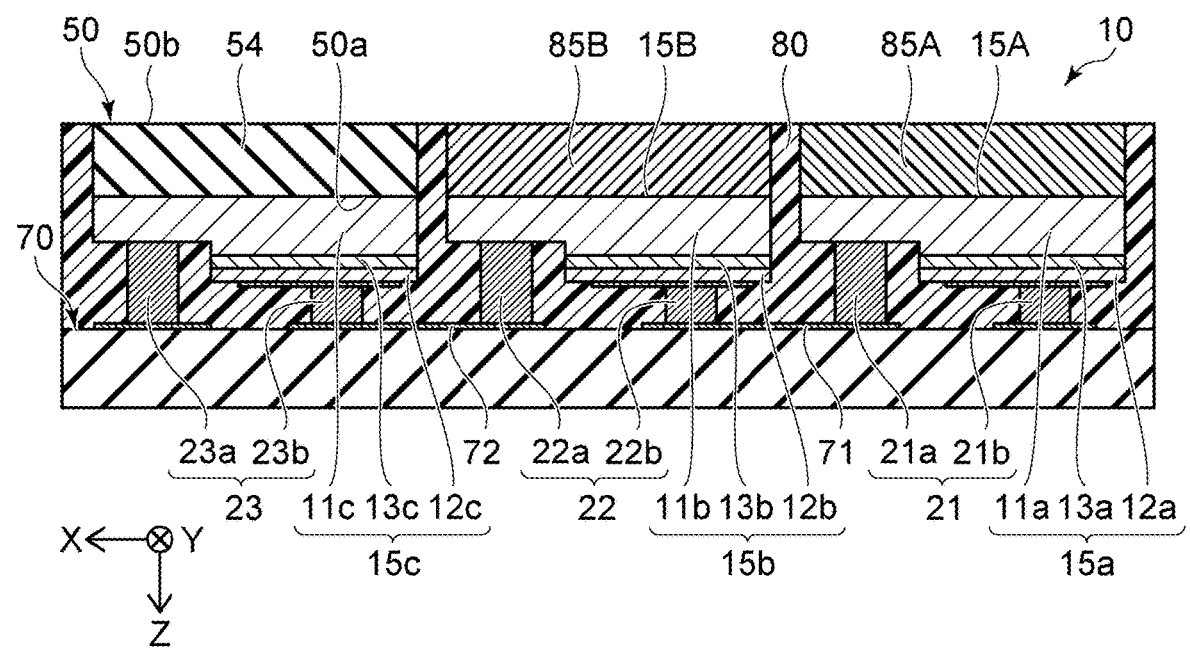
FIG. 13A is a schematic cross-sectional view illustrating a step in the method of manufacturing the light-emitting device according to the first embodiment.
Figure 13B:
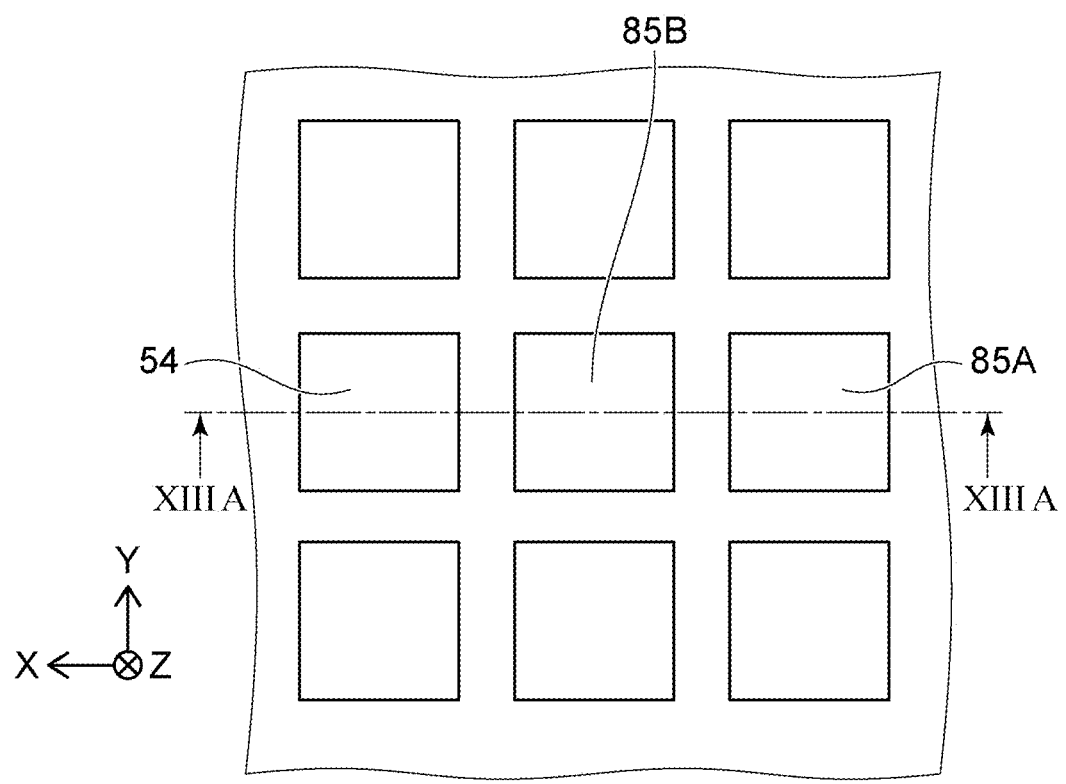
FIG. 13B is a schematic plan view illustrating the step in the method of manufacturing the light-emitting device according to FIG. 13A.

As shown in FIGS. 13A and 13B, the second mask member 82 is removed in the step S210 of removing the second mask member. When the second mask member 82 is a resist, the second mask member 82 can be removed by, for example, dry etching, wet etching, etc.

Figure 14A:
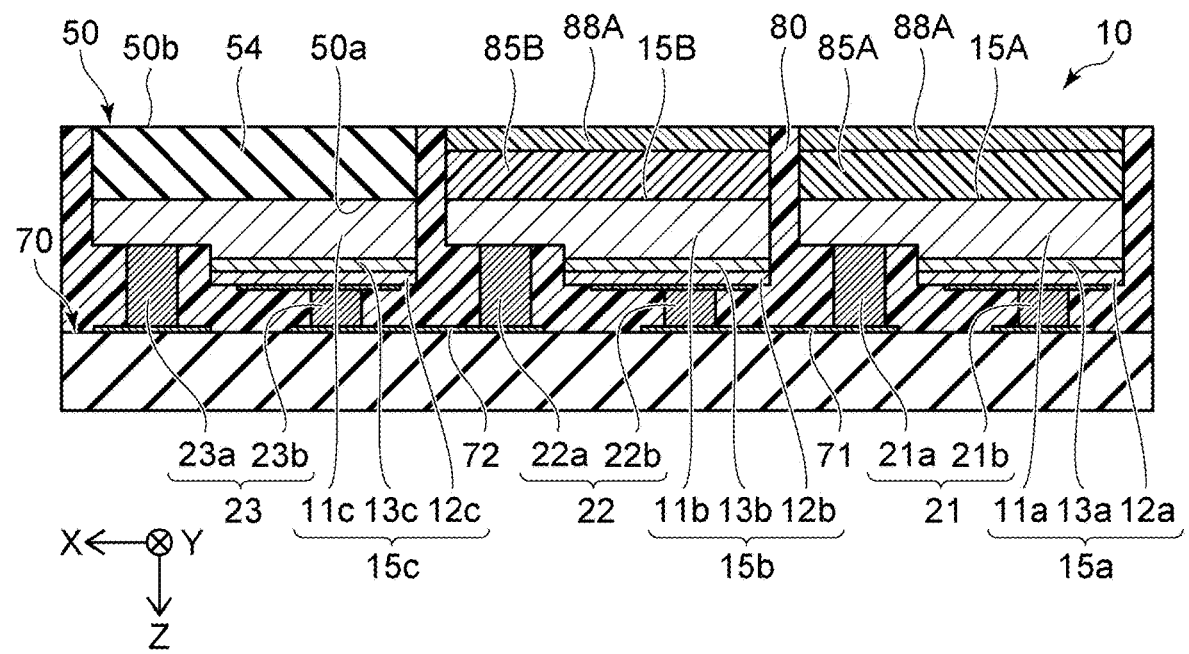
FIG. 14A is a schematic cross-sectional view illustrating a step in the method of manufacturing the light-emitting device according to the first embodiment.
Figure 14B:
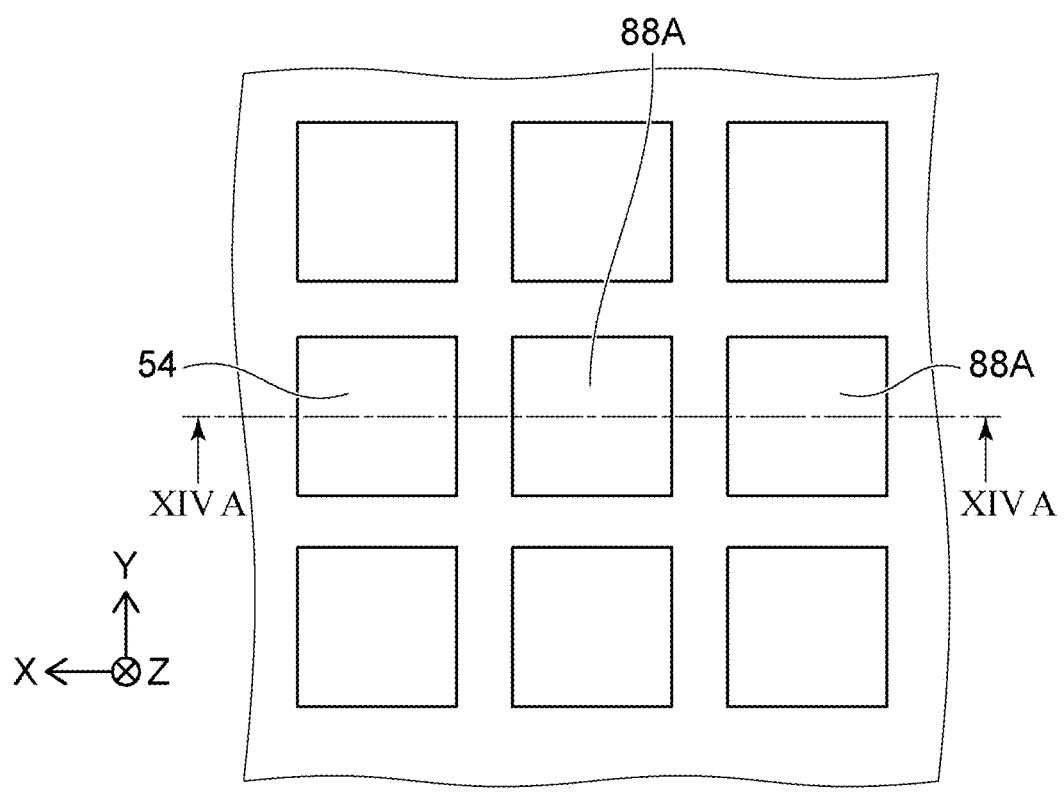
FIG. 14B is a schematic plan view illustrating the step in the method of manufacturing the light-emitting device according to FIG. 14A.

In the step S220 of disposing a first light-transmitting layer as shown in FIGS. 14A and 14B, a first light-transmitting layer 88A is disposed on the first and second wavelength conversion layers 85A and 85B. The first light-transmitting layer 88A includes, for example, a silicone resin, an epoxy resin, etc. For example, the first light-transmitting layer 88A functions as a protective layer. For example, the first wavelength conversion layer 85A and the second wavelength conversion layer 85B can be protected by the first light-transmitting layer 88A from a gas used in the removal when removing the fourth substrate region 54 that will be described below, etc. Disposing of the first light-transmitting layer 88A on the first wavelength conversion layer 85A may be performed before disposing the second mask member 82; in such a case, the first light-transmitting layer 88A can protect the first wavelength conversion layer 85A when removing the second mask member 82.

Figure 15A:
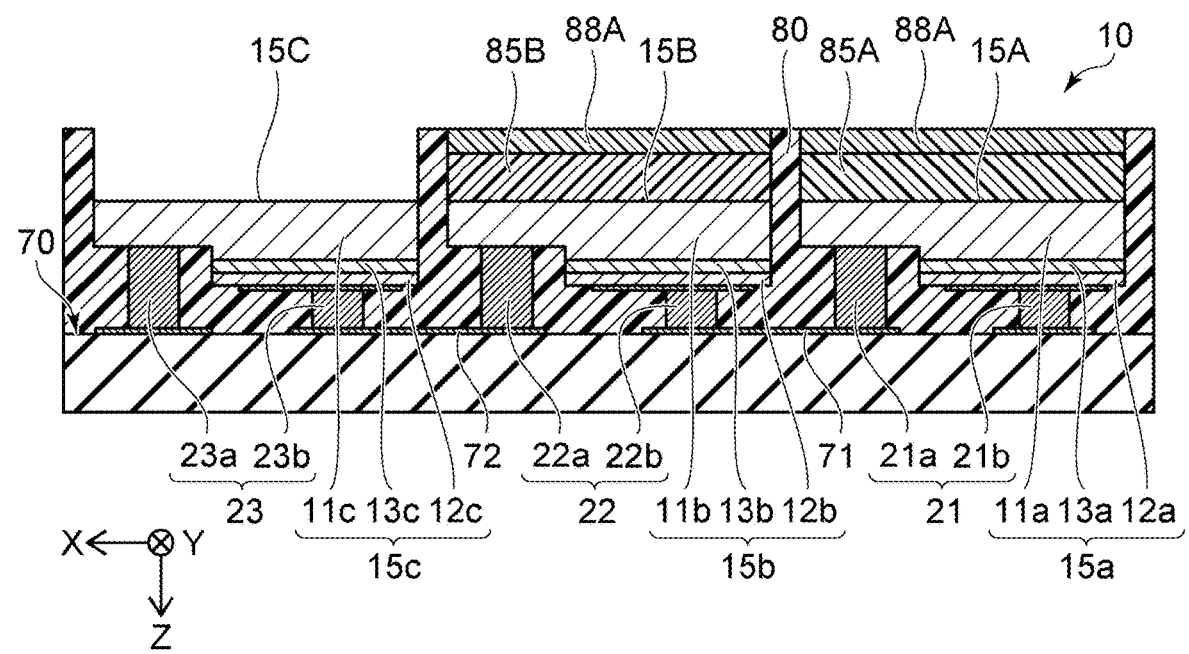
FIG. 15A is a schematic cross-sectional view illustrating a step in the method of manufacturing the light-emitting device according to the first embodiment.
Figure 15B:
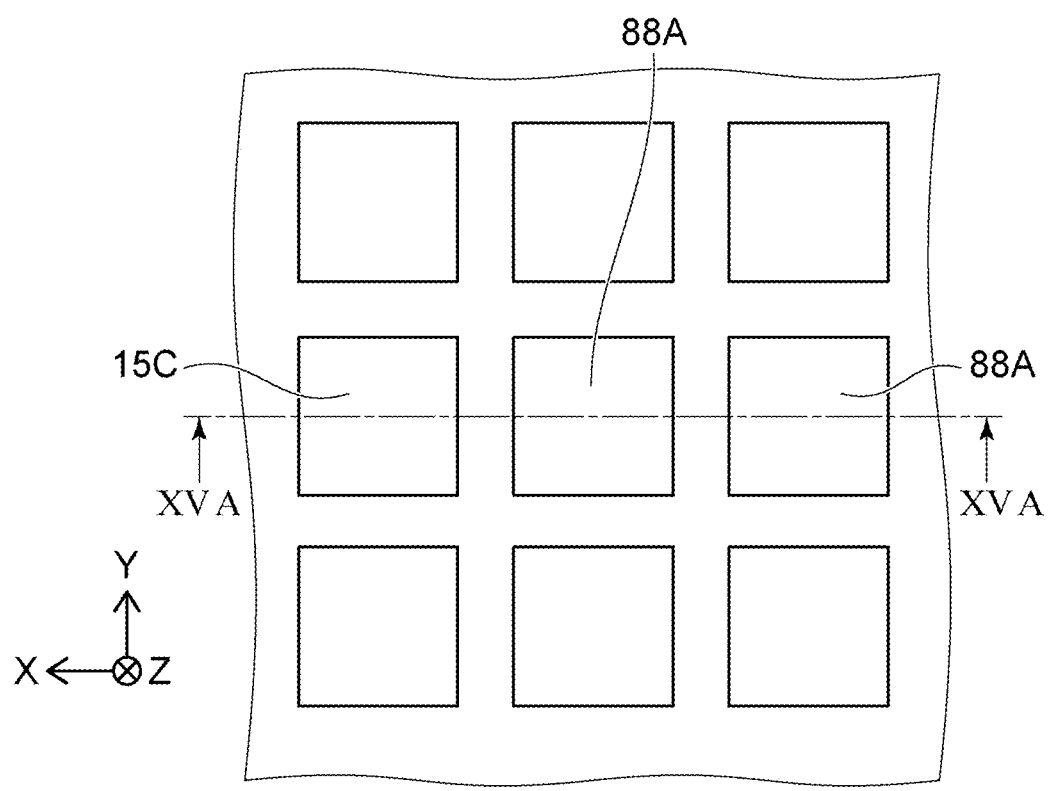
FIG. 15B is a schematic plan view illustrating the step in the method of manufacturing the light-emitting device according to FIG. 15A.

In the step S230 of forming a third region, as shown in FIGS. 15A and 15B, the fourth substrate region 54 is removed to expose the third semiconductor layered body 15c, so that a third region 15C is formed. In a top view, the third region 15C corresponds to at least a portion of the third semiconductor layered body 15c (e.g., the portion of the semiconductor layer 11c exposed from the resin layer 80).

Figure 16A:
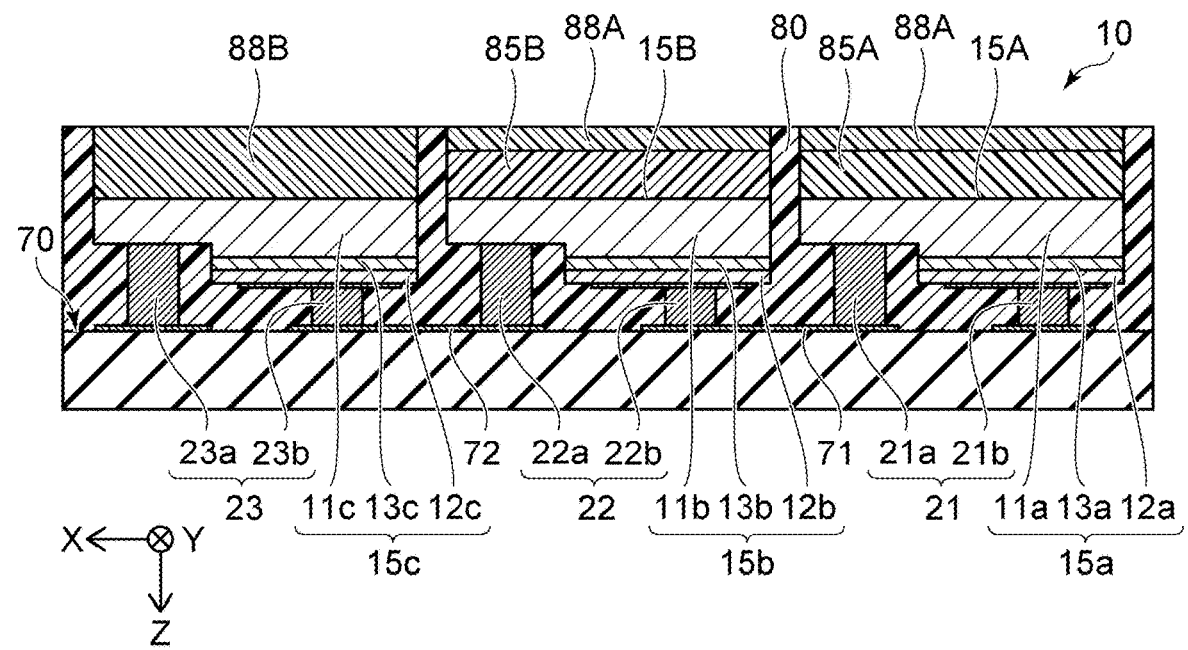
FIG. 16A is a schematic cross-sectional view illustrating a step in the method of manufacturing the light-emitting device according to the first embodiment.
Figure 16B:
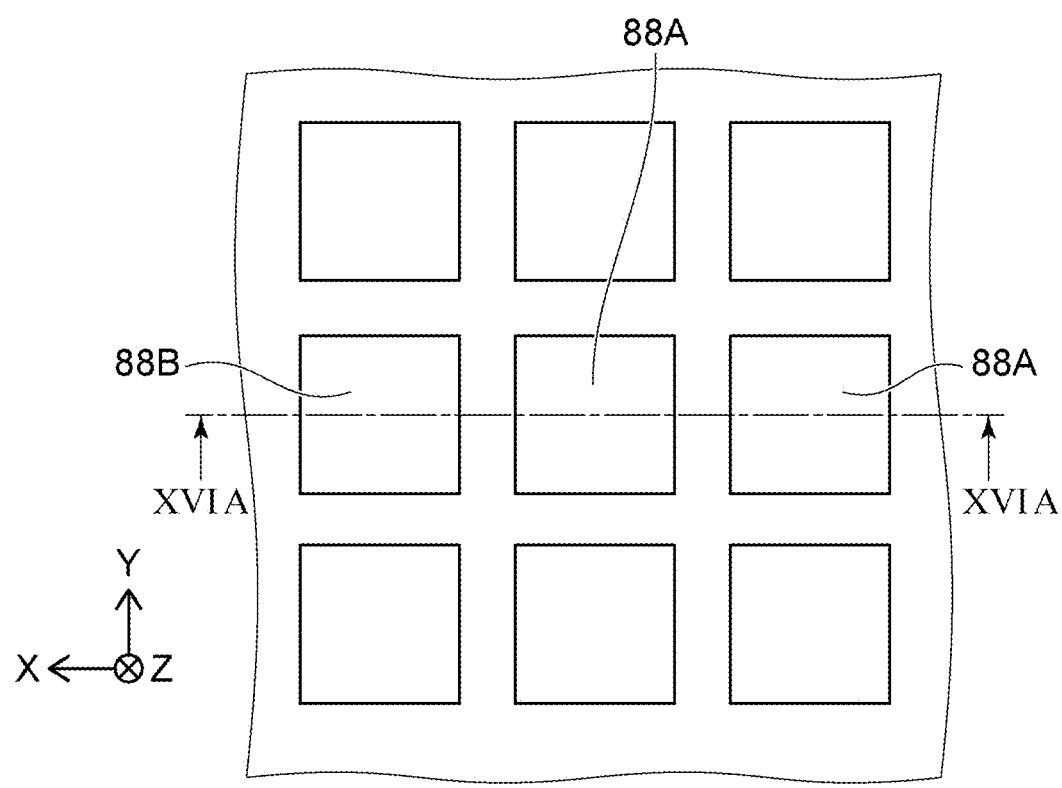
FIG. 16B is a schematic plan view illustrating the step in the method of manufacturing the light-emitting device according to FIG. 16A.

In the step S240 of disposing a second light-transmitting layer, as shown in FIGS. 16A and 16B, a second light-transmitting layer 88B is disposed on the third region 15C.

By performing the step S200 of disposing a second wavelength conversion layer described above, for example, the second wavelength conversion layer 85B adapted to emit light of a different color from the first wavelength conversion layer 85A can be disposed. Thus, according to the first embodiment, the number of types of light obtained can be increased while reducing variation of the intervals between the light-emitting elements and densely arranging the light-emitting elements.

Second Embodiment

Figure 17:
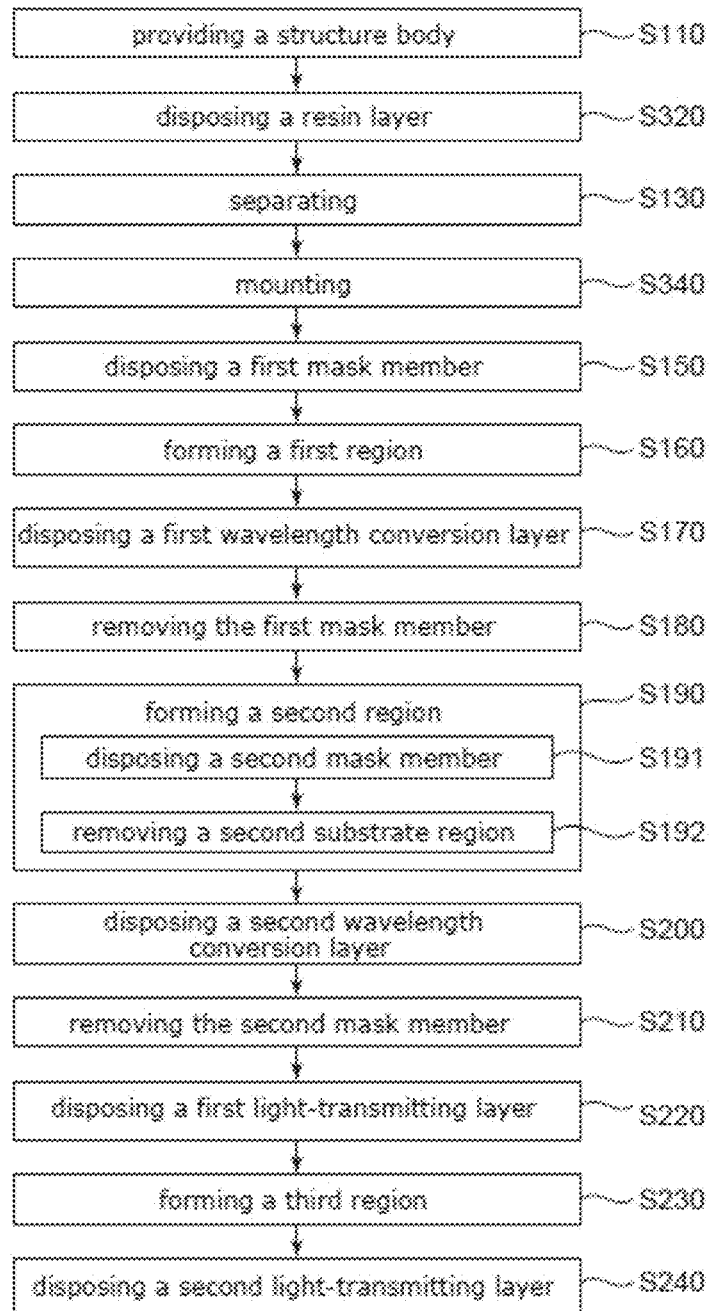
FIG. 17 is a flowchart illustrating a method of manufacturing a light-emitting device according to a second embodiment.

FIG. 17 is a flowchart illustrating a method of manufacturing a light-emitting device according to a second embodiment. Each of FIGS. 18A to 20A is a schematic cross-sectional view illustrating a step in the method of manufacturing the light-emitting device according to the second embodiment. Each of FIGS. 18B to 20B is a schematic plan view illustrating a step in the method of manufacturing the light-emitting device according to the second embodiment.

In the method of manufacturing the light-emitting device according to the present embodiment, as shown in FIG. 17, a step S340 of mounting is performed after a step S320 of disposing a resin layer. In the method of manufacturing the light-emitting device according to the second embodiment, steps after the step S340 of mounting may be similar to those in the method of manufacturing the light-emitting device according to the first embodiment may be performed after. Examples of the step S110 of providing a structure body, the step S320 of disposing a resin layer, the step S130 of separating, and the step S340 of mounting according to the second embodiment will be described below.

In the step S110 of providing a structure body, for example, the structure body 10 illustrated in FIGS. 2A and 2B described above is provided.

Figure 18A:
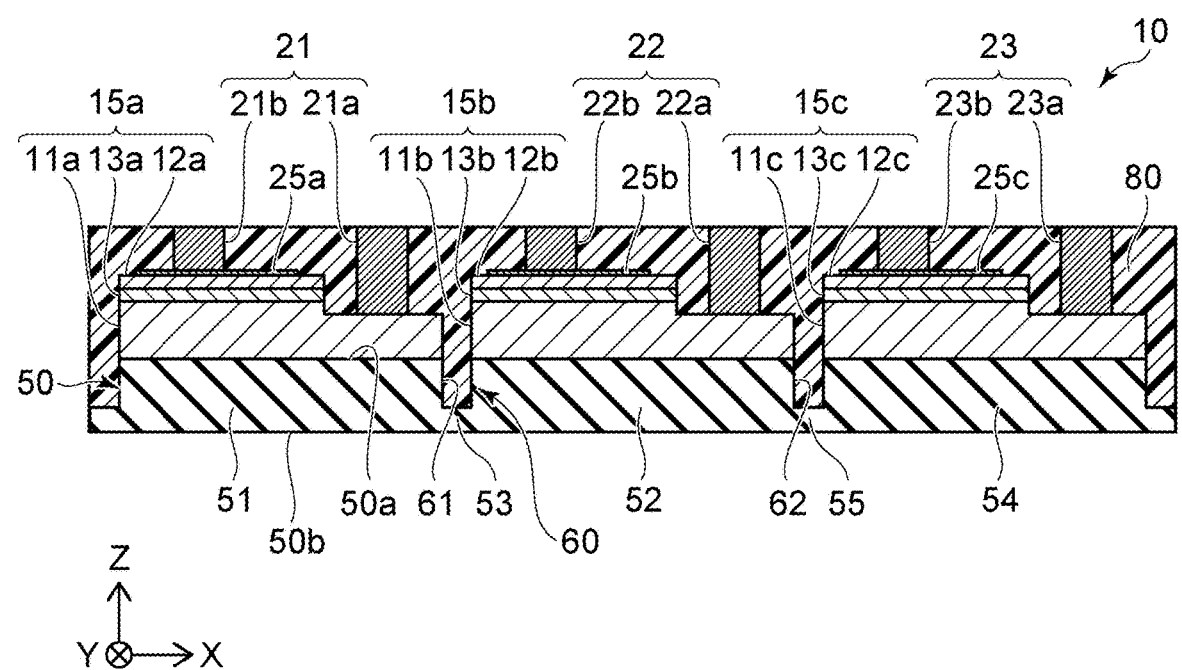
FIG. 18A is a schematic cross-sectional view illustrating a step in the method of manufacturing the light-emitting device according to the second embodiment.
Figure 18B:
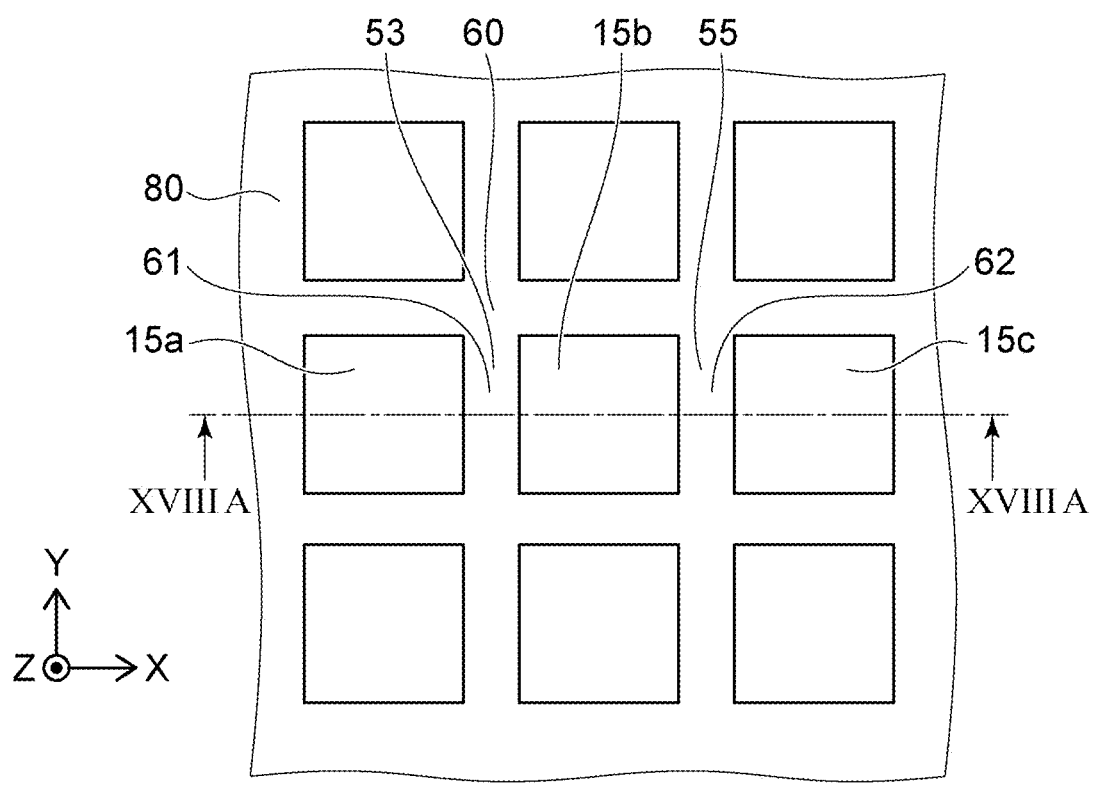
FIG. 18B is a schematic plan view illustrating the step in the method of manufacturing the light-emitting device according to FIG. 18A.

In the step S320 of disposing a resin layer, as shown in FIGS. 18A and 18B, the resin layer 80 is disposed to fill the groove 60 (the first groove 61 and the second groove 62) of the structure body 10.

Figure 19A:
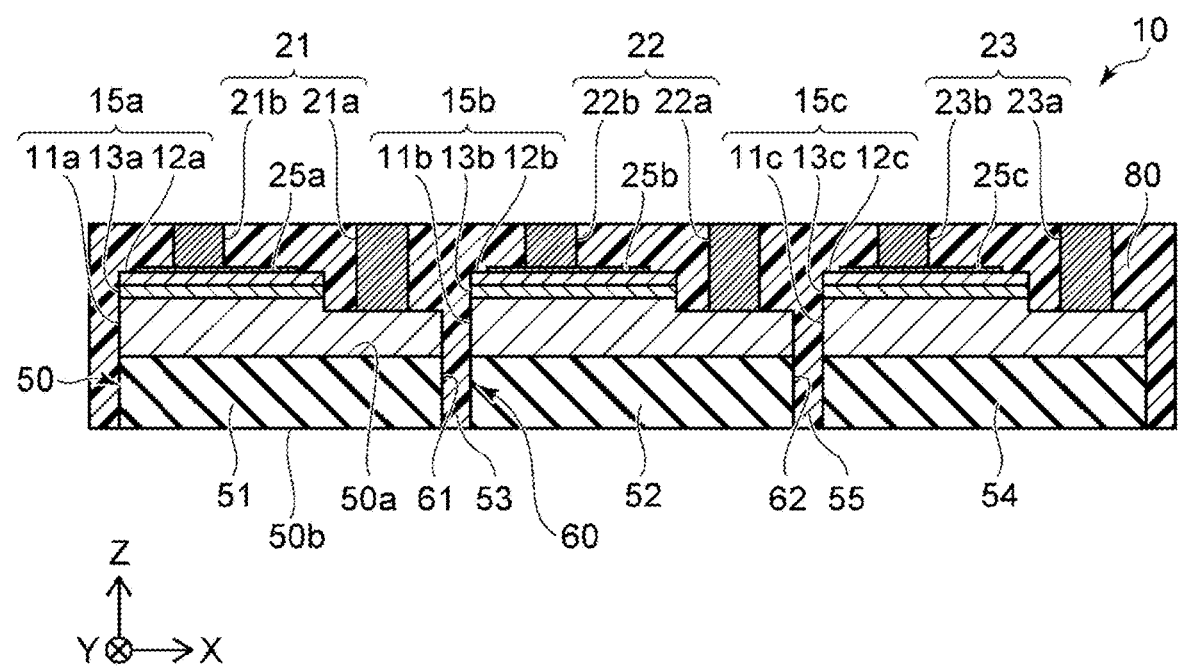
FIG. 19A is a schematic cross-sectional view illustrating a step in the method of manufacturing the light-emitting device according to the second embodiment.
Figure 19B:
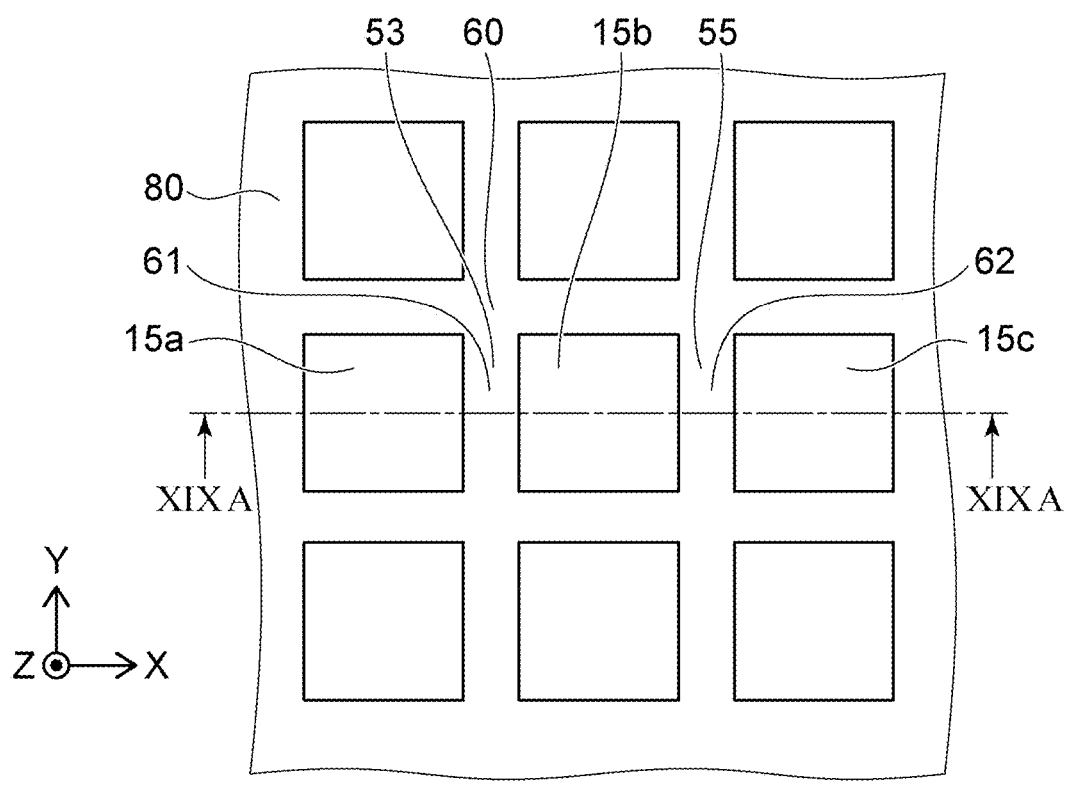
FIG. 19B is a schematic plan view illustrating the step in the method of manufacturing the light-emitting device according to FIG. 19A.

After the resin layer 80 is disposed, in the step S130 of separating as shown in FIGS. 19A and 19B, the third substrate region 53 is removed to separate the first substrate region 51 and the second substrate region 52. In this example, the fifth substrate region 55 is removed to separate the second substrate region 52 and the fourth substrate region 54. For example, the third substrate region 53 and the fifth substrate region 55 are removed from the second surface 50b side of the silicon substrate 50 in the removal of the third substrate region 53 and the fifth substrate region 55, respectively. Examples of a technique for the removal includes polishing, dry etching, and wet etching. Removal of the third substrate region 53 causes separation between the first substrate region 51 and the second substrate region 52. Removal of the fifth substrate region 55 causes separation between the second substrate region 52 and the fourth substrate region 54.

Figure 20A:
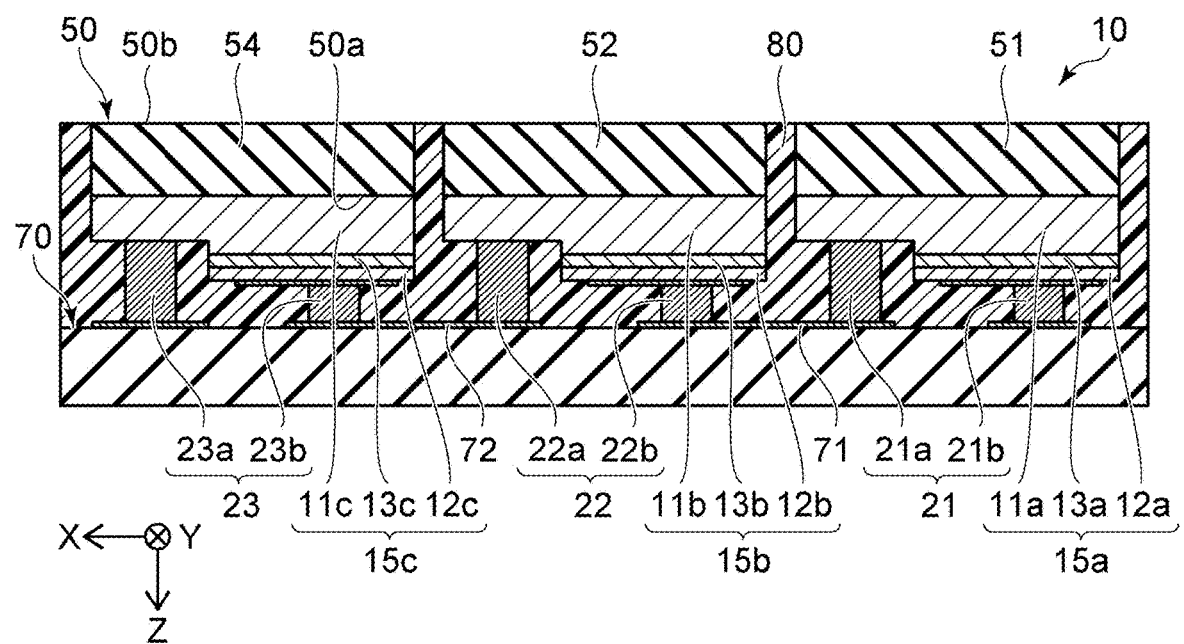
FIG. 20A is a schematic cross-sectional view illustrating a step in the method of manufacturing the light-emitting device according to the second embodiment.
Figure 20B:
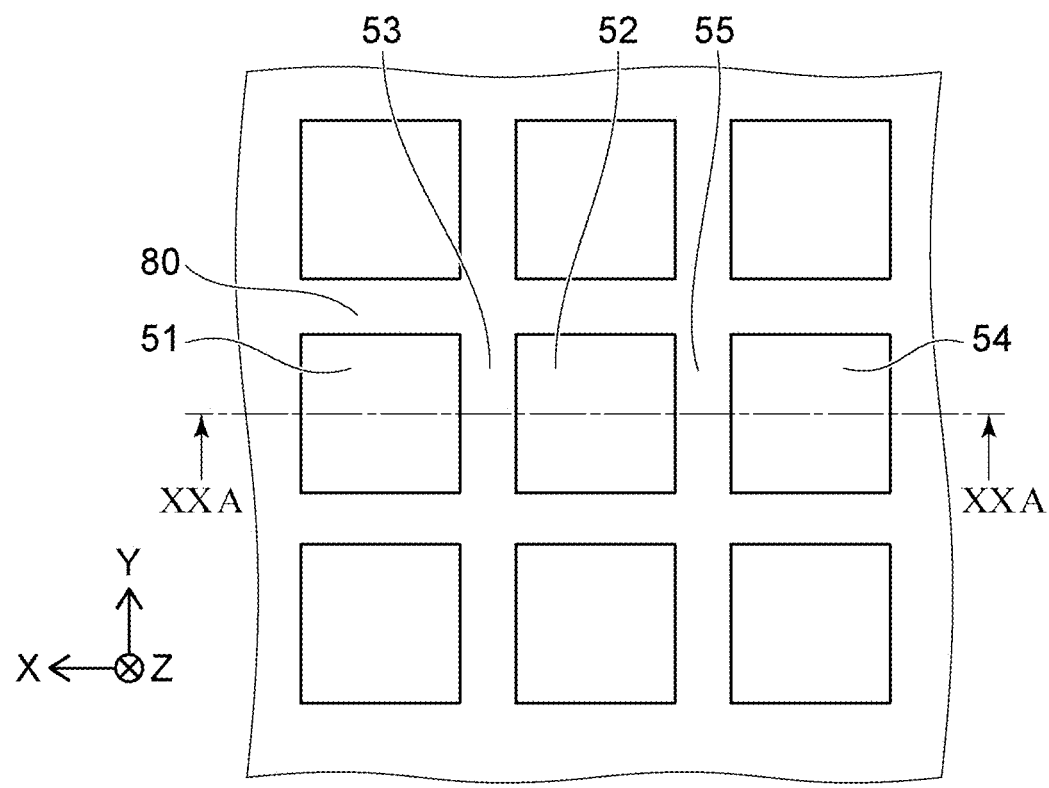
FIG. 20B is a schematic plan view illustrating the step in the method of manufacturing the light-emitting device according to FIG. 20A.

After the first substrate region 51 and the second substrate region 52 are separated and the second substrate region 52 and the fourth substrate region 54 are separated, in the mounting step S340 as shown in FIGS. 20A and 20B, the structure body 10 is mounted on the wiring substrate 70 via the first conductive member 21, the second conductive member 22, and the third conductive member 23. For example, the first semiconductor layered body 15a is mounted on the wiring substrate 70 via the conductive portions 21a and 21b, the second semiconductor layered body 15b is mounted on the wiring substrate 70 via the conductive portions 22a and 22b, and the third semiconductor layered body 15c is mounted on the wiring substrate 70 via the conductive portions 23a and 23b.

After the mounting step S340, it is sufficient to perform the processing as in the method of manufacturing the light-emitting device according to the first embodiment (the step S150 of disposing a first mask member, the step S160 of forming a first region, the step S170 of disposing a first wavelength conversion layer, the step S180 of removing the first mask member, and the step S190 of forming a second region), which has been described above. Also, the step S200 of disposing a second wavelength conversion layer, the step S210 of removing the second mask member, the step S220 of disposing a first light-transmitting layer, the step S230 of forming a third region, and the step S240 of disposing a second light-transmitting layer) also may be performed.

In the method of manufacturing the light-emitting device according to the second embodiment, the resin layer 80 is disposed on the plurality of semiconductor stacked bodies 15x (the first semiconductor layered body 15a, the second semiconductor layered body 15b, etc.) included in the structure body 10. The plurality of semiconductor stacked bodies 15x are singulated in this state after the structure body 10 is mounted on the wiring substrate 70. In the manufacturing method, the plurality of semiconductor stacked bodies 15x can be collectively mounted on the wiring substrate 70 in a state in which the plurality of semiconductor stacked bodies 15x in the structure body 10 are maintained in position. Also in the second embodiment, a plurality of light-emitting elements can be densely arranged, and the variation of the interval between the light-emitting elements can be suppressed.

In certain embodiments of the present invention, the semiconductor layers 11a, 11b, and 11c contain, for example, gallium and nitrogen. The semiconductor layers 12a, 12b, and 12c contain, for example, gallium and nitrogen. The active layers 13a, 13b, and 13c contain, for example, gallium, indium, and nitrogen.

The conductive portions 21a, 22a, and 23a contain, for example, Cu, Au, Al, etc. The conductive portions 21b, 22b, and 23b contain, for example, Cu, Au, Al, etc. The conductive layers 25a, 25b, and 25c contain, for example, Ag, ITO (indium tin oxide), Ni, etc.

According to certain embodiments of the present invention, the method of manufacturing the light-emitting device can be provided in which the plurality of light-emitting elements are densely arranged and the variations in intervals between the light-emitting elements is suppressed.

Hereinabove, certain embodiments of the invention are described with reference to specific examples. However, the invention is not limited to these specific examples. For example, one skilled in the art may similarly practice the invention by appropriately selecting specific configurations such as the substrate, the semiconductor layered body, and the resin layer included in the light-emitting device, etc., from known art, and such practice is within the scope of the invention to the extent that similar effects can be obtained.

Also, combinations of any two or more components of the specific examples within the extent of technical feasibility also are within the scope of the invention to the extent that the spirit of the invention is maintained.

What is claimed is:

1. A method of manufacturing a light-emitting device, the method comprising:
   providing a structure body comprising:
      a silicon substrate comprising a first surface in which a groove is formed,
      a first semiconductor layered body and a second semiconductor layered body that are disposed on the first surface,
      a first conductive member disposed on the first semiconductor layered body, and
      a second conductive member disposed on the second semiconductor layered body,
      wherein the silicon substrate comprises:
         a first substrate region facing the first semiconductor layered body,
         a second substrate region facing the second semiconductor layered body, and
         a third substrate region located between the first substrate region and the second substrate region, the third substrate region facing the groove;
   mounting the structure body on a wiring substrate via the first and second conductive members;
   after the step of mounting the structure body on the wiring substrate, removing the third substrate region to separate the first substrate region and the second substrate region;
   disposing a resin layer between the first substrate region and the second substrate region;
   disposing a first mask member to cover the second substrate region and to expose the first substrate region;
   removing the first substrate region in a state in which the second substrate region is covered with the first mask member to expose the first semiconductor layered body, thereby forming a first region;

disposing a first wavelength conversion layer on the first region;
removing the first mask member; and
removing the second substrate region to expose the second semiconductor layered body, thereby forming a second region.

2. The method of manufacturing the light-emitting device according to claim 1, further comprising:
disposing a second wavelength conversion layer at the second region,
wherein a peak wavelength of light emitted from the second wavelength conversion layer is different from a peak wavelength of light emitted from the first wavelength conversion layer.

3. The method of manufacturing the light-emitting device according to claim 2, wherein:
the structure body further comprises:
a third semiconductor layered body disposed on the first surface, and
a third conductive member disposed on the third semiconductor layered body,
the silicon substrate further comprises a fourth substrate region facing the third semiconductor layered body,
the step of mounting the wiring substrate further comprises mounting the third semiconductor layered body on the wiring substrate via the third conductive member,
the step of removing the second substrate region comprises:
disposing a second mask member to cover the first wavelength conversion layer and to expose the second substrate region, and
after the step of disposing the second mask member, removing the second substrate region in a state in which the first wavelength conversion layer is covered with the second mask member, and
the method further comprises:
removing the second mask member; and
removing the fourth substrate region to expose the third semiconductor layered body, forming a third region.

4. The method of manufacturing the light-emitting device according to claim 3, further comprising:
after the step of disposing the first wavelength conversion layer and the step of disposing second wavelength conversion layers and before the step of forming of the third region, disposing a first light-transmitting layer on the first and second wavelength conversion layers.

5. The method of manufacturing the light-emitting device according to claim 4, further comprising:
disposing a second light-transmitting layer on the third region.

6. The method of manufacturing the light-emitting device according to claim 3, further comprising:
disposing a second light-transmitting layer on the third region.

7. The method of manufacturing the light-emitting device according to claim 2, wherein:
the resin layer is light-reflective.

8. The method of manufacturing the light-emitting device according to claim 1, wherein:
the resin layer is light-reflective.

9. The method of manufacturing the light-emitting device according to claim 1, wherein:
in the step of disposing the first wavelength conversion layer, the first wavelength conversion layer is disposed by electrodeposition.

10. The method of manufacturing the light-emitting device according to claim 1, wherein:
in the step of disposing the first wavelength conversion layer, the first wavelength conversion layer is disposed by coating.

11. A method of manufacturing a light-emitting device, the method comprising:
providing a structure body comprising:
a silicon substrate comprising a first surface in which a groove is formed,
a first semiconductor layered body and a second semiconductor layered body that are disposed on the first surface,
a first conductive member disposed on the first semiconductor layered body, and
a second conductive member disposed on the second semiconductor layered body,
wherein the silicon substrate comprises:
a first substrate region facing the first semiconductor layered body,
a second substrate region facing the second semiconductor layered body, and
a third substrate region located between the first substrate region and the second substrate region, the third substrate region facing the groove;
disposing a resin layer in the groove;
after the step of disposing the resin layer, removing the third substrate region to separate the first substrate region and the second substrate region;
after the step of removing the third substrate region, mounting the first semiconductor layered body on a wiring substrate via the first conductive member and mounting the second semiconductor layered body on the wiring substrate via the second conductive member;
disposing a first mask member to cover the second substrate region and to expose the first substrate region;
removing the first substrate region in a state in which the second substrate region is covered with the first mask member to expose the first semiconductor layered body, thereby forming a first region;
disposing a first wavelength conversion layer on the first region;
removing the first mask member; and
removing the second substrate region to expose the second semiconductor layered body, thereby forming a second region.

12. The method of manufacturing the light-emitting device according to claim 11, further comprising:
disposing a second wavelength conversion layer at the second region,
wherein a peak wavelength of light emitted from the second wavelength conversion layer is different from a peak wavelength of light emitted from the first wavelength conversion layer.

13. The method of manufacturing the light-emitting device according to claim 12, wherein:
the structure body further comprises:
a third semiconductor layered body disposed on the first surface, and
a third conductive member disposed on the third semiconductor layered body,
the silicon substrate further comprises a fourth substrate region facing the third semiconductor layered body,
the mounting of the wiring substrate further comprises mounting the third semiconductor layered body on the wiring substrate via the third conductive member, the step of removing the second substrate region comprises:
  disposing a second mask member to cover the first wavelength conversion layer and to expose the second substrate region, and
  after the step of disposing the second mask member, removing the second substrate region in a state in which the first wavelength conversion layer is covered with the second mask member, and
the method further comprises:
  removing the second mask member; and
  removing the fourth substrate region to expose the third semiconductor layered body, forming a third region.

14. The method of manufacturing the light-emitting device according to claim 13, further comprising:
  after the step of disposing the first wavelength conversion layer and the step of disposing second wavelength conversion layers and before the step of forming of the third region, disposing a first light-transmitting layer at the first and second wavelength conversion layers.

15. The method of manufacturing the light-emitting device according to claim 14, further comprising:
  disposing a second light-transmitting layer on the third region.

16. The method of manufacturing the light-emitting device according to claim 13, further comprising:
  disposing a second light-transmitting layer on the third region.

17. The method of manufacturing the light-emitting device according to claim 12, wherein:
  the resin layer is light-reflective.

18. The method of manufacturing the light-emitting device according to claim 11, wherein:
  the resin layer is light-reflective.

19. The method of manufacturing the light-emitting device according to claim 11, wherein:
  in the step of disposing the first wavelength conversion layer, the first wavelength conversion layer is disposed by electrodeposition.

20. The method of manufacturing the light-emitting device according to claim 11, wherein:
  in the step of disposing the first wavelength conversion layer, the first wavelength conversion layer is disposed by coating.

* * * * *